US007962836B1

(12) United States Patent　　(10) Patent No.: US 7,962,836 B1
Lee et al.　　(45) Date of Patent: Jun. 14, 2011

(54) ELECTRONIC DATA FLASH CARD WITH BOSE, RAY-CHAUDHURI, HOCQUENGHEM (BCH) ERROR DETECTION/CORRECTION

(75) Inventors: Charles C. Lee, Cupertino, CA (US);
I-Kang Yu, Palo Alto, CA (US);
Abraham C. Ma, Fremont, CA (US);
Ming-Shiang Shen, Taipei Hsien (TW)

(73) Assignee: SuperTalent Electronics, Inc., San Jose, CA (US)

( * ) Notice: Subject to any disclaimer, the term of this patent is extended or adjusted under 35 U.S.C. 154(b) by 1175 days.

(21) Appl. No.: 11/657,243

(22) Filed: Jan. 24, 2007

Related U.S. Application Data

(63) Continuation-in-part of application No. 11/466,759, filed on Aug. 23, 2006, now Pat. No. 7,702,831, which is a continuation-in-part of application No. 10/789,333, filed on Feb. 26, 2004, now Pat. No. 7,318,117, and a continuation-in-part of application No. 09/478,720, filed on Jan. 6, 2000, now Pat. No. 7,257,714.

(51) Int. Cl.
*H03M 13/00* (2006.01)
(52) U.S. Cl. .......................... 714/781; 714/782
(58) Field of Classification Search .................. 714/781, 714/782
See application file for complete search history.

(56) References Cited

U.S. PATENT DOCUMENTS

| 4,498,175 | A | * | 2/1985 | Nagumo et al. | 714/756 |
|---|---|---|---|---|---|
| 5,710,782 | A | * | 1/1998 | Weng | 714/785 |
| 5,761,102 | A | * | 6/1998 | Weng | 708/492 |
| 5,983,389 | A | * | 11/1999 | Shimizu | 714/781 |
| 6,637,002 | B1 | * | 10/2003 | Weng et al. | 714/781 |
| 7,407,393 | B2 | | 8/2008 | Ni et al. | |
| 7,420,803 | B2 | | 9/2008 | Hsueh et al. | |

* cited by examiner

*Primary Examiner* — Sam Rizk
(74) *Attorney, Agent, or Firm* — Maryam Imam; IPxLaw Group LLP

(57) ABSTRACT

A Bose, Ray-Chaudhuri, Hocquenghem (BCH) decoder is employed in non-volatile memory applications for determining the number of errors and locating the errors in a page of information. The decoder includes a syndrome calculator responsive to a sector of information. The sector includes data and overhead, with the data being organized into data sections and the overhead being organized into overhead sections. The syndrome calculator generates a syndrome for each of the data sections. A root finder is coupled to receive the calculated syndrome and to generate at least two roots. A polynomial calculator responds to the two roots and generates at least two error addresses, each identifying a location in the data wherein the error lies.

15 Claims, 25 Drawing Sheets

$$(1 + \beta_1\alpha + \beta_2\alpha^2 + \beta_3\alpha^3 + \beta_4\alpha^4 + \beta_5\alpha^5 + \beta_6\alpha^6 + \beta_7\alpha^7 + \beta_8\alpha^8 + \beta_9\alpha^9 + \beta_{10}\alpha^{10})$$

$$(\beta_1\alpha + \beta_2\alpha^2 + \beta_3\alpha^3 + \beta_4\alpha^4 + \beta_5\alpha^5 + \beta_6\alpha^6 + \beta_7\alpha^7 + \beta_8\alpha^8 + \beta_9\alpha^9 + \beta_{10}\alpha^{10})\ \ *$$

$$= (\beta_{10} * \alpha^{20} + \beta_9 * \alpha^{18} + \beta_8 * \alpha^{16} + \beta_7 * \alpha^{14} + (\beta_6 * \alpha^{12}) + (\beta_{10} + \beta_5) * \alpha^{10} + \beta_9 * \alpha^9 + (\beta_8 + \beta_4) * \alpha^8 + \beta_7 * \alpha^7 + (\beta_6 + \beta_3) * \alpha^6$$
$$+ \beta_5 * \alpha^5 + (\beta_4 + \beta_2) * \alpha^4 + \beta_3 * \alpha^3 + (\beta_2 + \beta_1) * \alpha^2 + \beta_1 * \alpha = K$$

| | | | | | | | | | | |
|---|---|---|---|---|---|---|---|---|---|---|
| β10 | β9 | β8 | β7 | β6 | β5 | β4 | β3 | β2 | β1 | 1 |
| * | β10 | β9 | β8 | β7 | β6 | β5 | β4 | β3 | β2 | β1 |
| β10 | β10β9 | β10β8 | β10β7 | β10β6 | β10β5 | β10β4 | β10β3 | β10β2 | β10β1 | β10 |
| β10β9 | β9 | β9β8 | β9β7 | β9β6 | β9β5 | β9β4 | β9β3 | β9β2 | β9β1 | β9 |
| β10β8 | β9β8 | β8 | β8β7 | β8β6 | β8β5 | β8β4 | β8β3 | β8β2 | β8β1 | β8 |
| β10β7 | β9β7 | β8β7 | β7 | β7β6 | β7β5 | β7β4 | β7β3 | β7β2 | β7β1 | β7 |
| β10β6 | β9β6 | β8β6 | β7β6 | β6 | β6β5 | β6β4 | β6β3 | β6β2 | β6β1 | β6 |
| β10β5 | β9β5 | β8β5 | β7β5 | β6β5 | β5 | β5β4 | β5β3 | β5β2 | β5β1 | β5 |
| β10β4 | β9β4 | β8β4 | β7β4 | β6β4 | β5β4 | β4 | β4β3 | β4β2 | β4β1 | β4 |
| β10β3 | β9β3 | β8β3 | β7β3 | β6β3 | β5β3 | β4β3 | β3 | β3β2 | β3β1 | |
| β10β2 | β9β2 | β8β2 | β7β2 | β6β2 | β5β2 | β4β2 | β3β2 | β2 | | |

Key to FIG. 7

| FIG. 7a | FIG. 7b |
|---|---|
| FIG. 7c | FIG. 7d |

| | β10β1 | β9β1 | β8β1 | β7β1 | β6β1 | β5β1 | β4β1 | β3β1 |
|---|---|---|---|---|---|---|---|---|
| | | | | β8+β4 | β7 | β6+β3 | β5 | β4+β2 |
| | | | β9 | | | | | |
| | | β10+β5 | | | | | | |
| β6 | | | | | | | | |
| 0 | | | | | | | | |
| β7 | | | | | | | | |
| 0 | | | | | | | | |
| β8 | | | | | | | | |
| 0 | | | | | | | | |
| β9 | | | | | | | | |
| 0 | | | | | | | | |
| β10 | | | | | | | | |

| $\alpha^{20}$ | $\alpha^{18}$ | $\alpha^{16}$ | $\alpha^{14}$ | $\alpha^{12}$ | $\alpha^{10}$ | $\alpha^9$ | $\alpha^8$ | $\alpha^7$ | $\alpha^6$ | $\alpha^5$ | $\alpha^4$ |

*FIG. 7c*

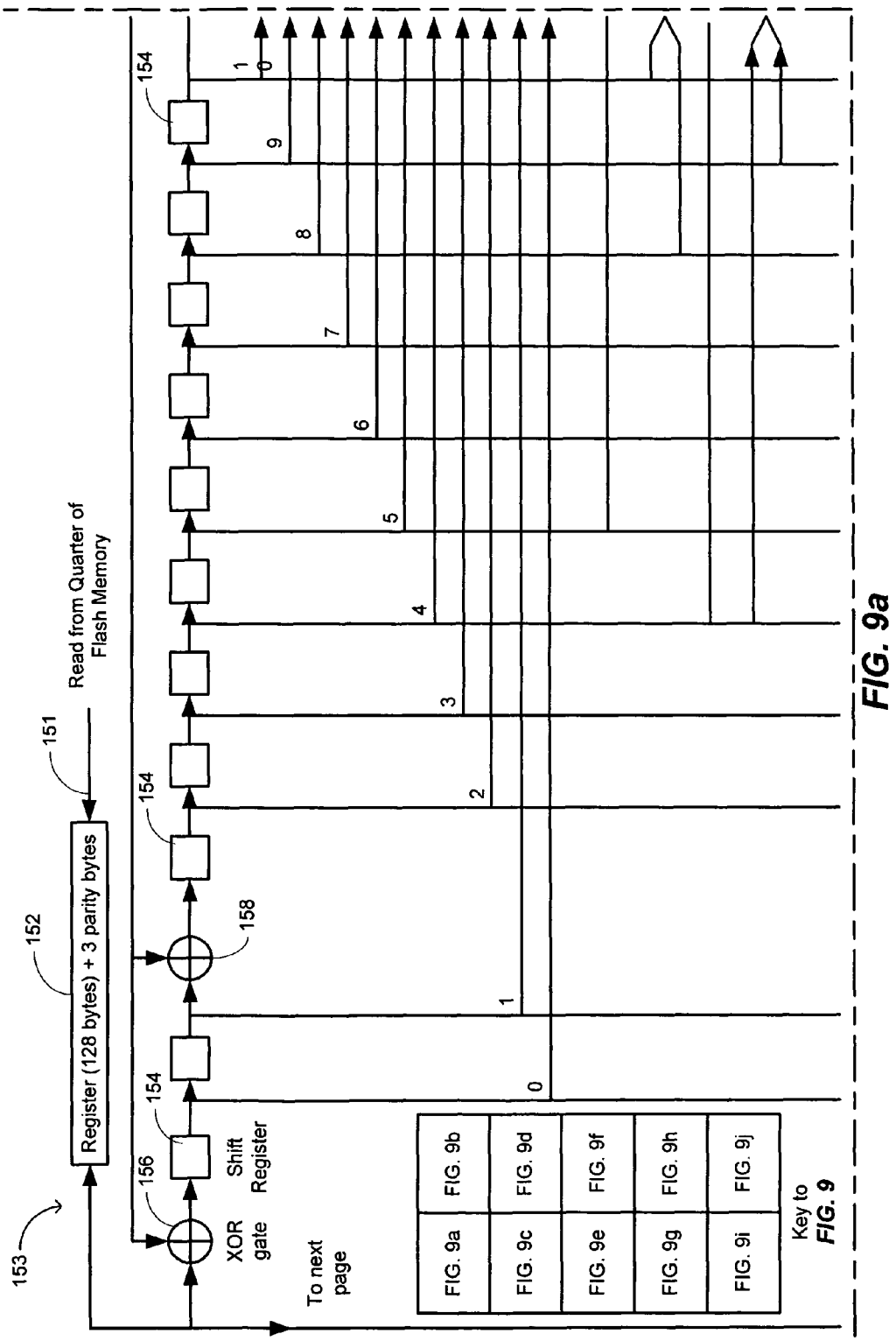

ELECTRONIC DATA FLASH CARD WITH BOSE, RAY-CHAUDHURI, HOCQUENGHEM (BCH) ERROR DETECTION/CORRECTION

CROSS REFERENCE TO RELATED APPLICATION

This application is a continuation-in-part (CIP) of the application entitled "Electronic Data Storage Medium with Fingerprint Verification Capability", U.S. patent application Ser. No. 09/478,720, filed on Jan. 6, 2000 now U.S. Pat. No. 7,257,714, and a continuation-in-part of the application entitled "Flash Memory Controller For Electronic Data Flash Card", U.S. patent application Ser. No. 11/466,759, filed on Aug. 23, 2006 now U.S. Pat. No. 7,702,831, which is a CIP of "System and Method for Controlling Flash Memory", U.S. patent application. Ser. No. 10/789,333, filed on Feb. 26, 2004 now U.S. Pat. No. 7,318,117, all of which are incorporated herein as though set forth in full.

BACKGROUND OF THE INVENTION

1. Field of the Invention

The present invention relates to non-volatile memory devices and particularly to an error detection method apparatus for use in the non-volatile memory devices.

2. Description of the Prior Art

Flash or non-volatile memory has gained wide acceptance for various applications and particularly its non-volatile characteristic in retaining information or data even when power is disconnected. This makes non-volatile memory especially well suited for non-volatile portable devices that may lose power. Some devices, which include flash memory are constructed from electrically-erasable programmable read-only memory (EEPROM) cells.

Rather than use a randomly-addressable scheme such as is common with dynamic-random-access memory (DRAM), many flash memory-based devices use a block-based addressing where a command and an address are transmitted via a data bus and then a block of information is read from or written to the flash memory. Since the data bus is also used to send commands and addresses, fewer pins are needed on the flash-memory chip thereby reducing cost. Thus, flash memory is often used as a mass-storage device rather than a randomly-addressable device.

Typically, in a flash memory device, a microcontroller is employed for controlling information transfer between the flash memory and a host of some type. The microcontroller typically includes ROM with a control program that is read by the internal central processing unit (CPU) of the microcontroller when the microcontroller is booted or powered up. Once initialized with the control program, the CPU can control data transfers between the serial interface and the flash controller.

A popular bus standard is a Multi-Media Card (MMC), the specifications of which are defined and adopted by the industry. An extension of MMC is known as Secure Digital (SD). Various other flash device interfaces such as Compact Flash (CF), Memory Stick (MS), PCI-Express (PCIE), ATA/IDE, and Serial ATA (SATA), etc, which are commonly employed in today's portable multimedia, computer, or communication devices as data storage elements. A controller coupled to the bus would also operationally conform to the foregoing standards.

With the advent of the popularity of flash memory, density of flash memory devices (or chips, integrated circuits or semiconductor) is increasing thereby increasing the rate of defect spots. Even more noteworthy is the increase in the rate of defect spots in Multi-Level Cell (MLC), which is a certain type of non-volatile memory, during the flash manufacturing process. Compared with a SLC process, random error bits in MLC processes occur more often due to multi-level threshold voltages (less noise margin) needed to detect logic levels.

An effective error detection results when using Bose, Ray-Chaudhuri, Hocquenghem (BCH) code. Therefore, an apparatus and method are needed for flash operations to improve the accuracy of information.

BCH codes are multiple error correcting utilizing block cyclic Galois codes to do the same. As described earlier, the BCH algorithm is popularly applied in the industry for random error correction purposes and as compared with Reed Solomon algorithms, another error coding/decoding scheme, it is more appropriate for burst error correction. Error location/detection is known to be one of the most difficult procedures associated with using BCH.

By way of brief background, a Berlekamp-Messay and Euclidian method is first applied to find roots of the error polynomial and then, Chien's method is applied to search for error locations. However, since both implementations require complex hardware and lengthy calculations, cost of error correction coding (ECC) is increased in the foregoing traditional methods.

A second method utilizes searching in look-up table. A pre-calculated value is stored in memory, such as ROM, for error searching. This method advantageously increases speed, because time is saved in performing calculations, however, for long size codes, ROM could occupy expensive silicon real estate and therefore directly increases controller chip cost.

What is needed is flash memory coding and decoding apparatus and method having advantageously lower complexity with simple control signal handling and faster calculation speed that is not influenced by code length.

SUMMARY OF THE INVENTION

Briefly, one embodiment of the present includes a BCH decoder employed in non-volatile memory applications for determining the number of errors and locating the errors in a page of information. The decoder is disclosed to include a syndrome calculator responsive to a sector of information, the sector including data and overhead, the data being organized into a plurality of data sections and the overhead being organized into a plurality of overhead sections, the syndrome calculator operative to generate a syndrome for each of the data sections, a root finder coupled to receive the calculated syndrome and operative to generate at least two roots, and a polynomial calculator responsive to the at least two roots and operative to generate at least two error addresses, each identifying a location in the data wherein the error lies.

IN THE DRAWINGS

FIG. 1 shows a BCH decoder, in accordance with an embodiment of the present invention.

FIG. 2 shows a flash memory page structure 22 having a data area 24 and a spare area 24, in accordance with an embodiment of the present invention.

DETAILED DESCRIPTION OF THE PREFERRED EMBODIMENT

In one embodiment of the present invention, BCH algorithm is employed to reduce hardware costs associated with silicon real estate of a non-volatile memory device including ECC and in particular to reduce the size of the ROM look-up table employed therein. Additionally, lengthy calculations are eliminated by using Chien's searching algorithm in the ECC. One of the applications of the foregoing is in non-volatile memory systems replacing hard disk drives and transferring information organized in sectors between a host and non-volatile memory. A sector can vary in size and in some applications are 512 bytes of raw data and additional bytes of overhead.

Typically, there are six procedures involved in BCH decoding process that is outlined below in the case where information is organized in sectors:

(1). Syndrome calculation: Each syndrome is calculated based on a read out string of data (which may contain multiple bits of errors) from flash memory, a non-zero value of syndrome result determines the possible error number.

(2). Error location polynomial calculation: The polynomial coefficients are determined using an iterative method.

(3). Roots are determined based on Error Location Polynomial determined in step (2) through trial and error substitution methods.

(4). Reciprocal of the roots of step (3) are used to determine the error location of read out strings.

(5). Use of Exclusive Or (XOR) function for read out flash data value and inversed Error location polynomial coefficient to determine error values associated with each error location.

(6). Recover original strings of correct value and return a 512 bytes sector data to request unit.

At step (2), typically Berlekamp-Messay recursive method or Euclidian's matrix method is employed, the complexity of these two methods is dependent on code length, and independent of number of errors, so it is very inefficient from a calculation point of view.

At step (3), in finding or determining the roots of an error polynomial, Chien's search method is typically adopted and the calculation time also depends on the code length, and independent of number of errors, since an exhausted search needs to be performed, and time is a constant in this step.

However, the foregoing two methods do not advantageously utilize the characteristic of low error counts of flash memory, furthermore, sophisticated hardware and longer calculation time result.

One embodiment of the present invention takes advantage of and relies on the low error count associated with flash or non-volatile memory. More specifically, emphasis is placed on being able to correct up to two error counts per code word. The Syndrome result is used to determine an error location, which is known to be the most difficult part of implementing the BCH algorithm.

Figure 1:
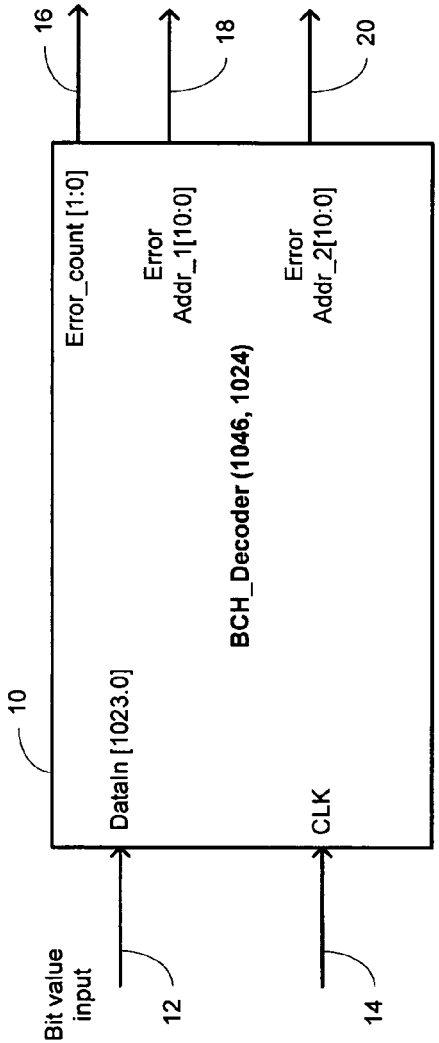

Referring now to FIG. 1, a BCH decoder 10 is shown to receive data on the data bus 12, in synchronicity with a clock signal 14 and operative to generate an error count on the error count signals 16 and an error address 1 on an error address 1 signal 18 and an error address 2 on an error address 2 signal 20, in accordance with an embodiment of the present invention. The data bus 12 carries data of various bit sizes. In the embodiment of FIG. 1, the data is 1024 bits and the error count on the signals 16 is two bits so as to have the capability of reporting up to two errors in the data. In the event there is one error in the data, the location of the error is indicated on the signal 18 and in the event there is a second error, the location of the second error is indicated on the signal 20. While the decoder 10 can be employed in various applications requiring error detection and correction, it is employed in flash (or non-volatile) memory applications, as shown and discussed herein.

Figure 2:
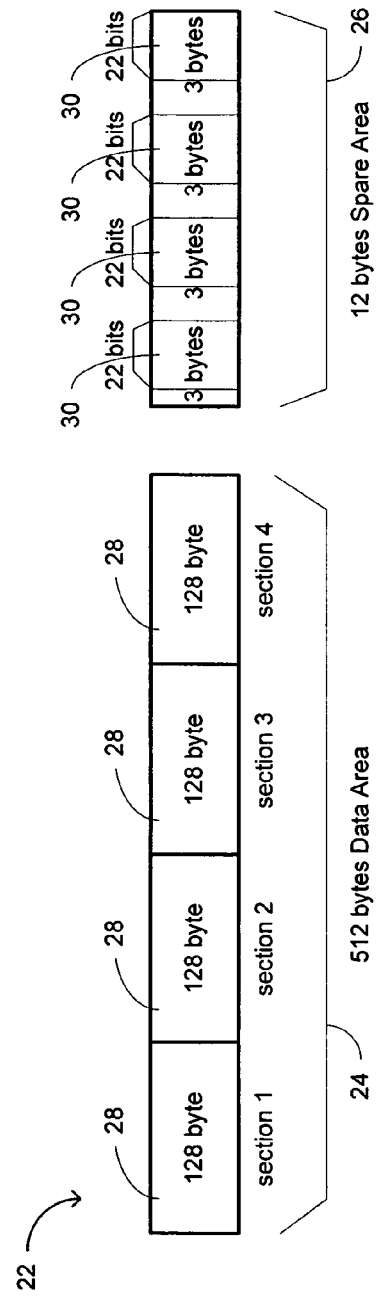

FIG. 2 shows a flash memory page structure 22 having a data area 24 and a spare area 24, in accordance with an embodiment of the present invention. The spare area 24 includes the overhead earlier mentioned. The data area 24 includes the raw data earlier mentioned. A page, in certain flash or non-volatile memory applications, is the same as a sector. While a page may of varying sizes, in the embodiment of FIG. 2, a page is 528 bytes, 512 bytes of which are data and 12 bytes of which are overhead or spare dedicated for ECC purpose. In FIG. 2, data in the data area 24, is organized into four data area sections with each data area section 28 being 128 bytes in size, although, other number of sections may comprise a sector and a section may include other number of bytes. The spare area 26 is shown to include 12 bytes of overhead organized into four sections with each section being three bytes, or 24 bits, in size. Since in the BCH algorithm of the exemplary embodiment of FIG. 2, m=11, for 2 bits correctable error capability per 128 bytes, only 22 bits in 24 bits is utilized for ECC purpose.

Sectional organization of the data area 24 and the spare area 26 causes reduction in the code length, in turn, simplifying the BCH method by parallel processing 4 sections (each section being 128 bytes) at the same time with the total error that is correctable being 8 bits per 512 bytes.

Figure 3:
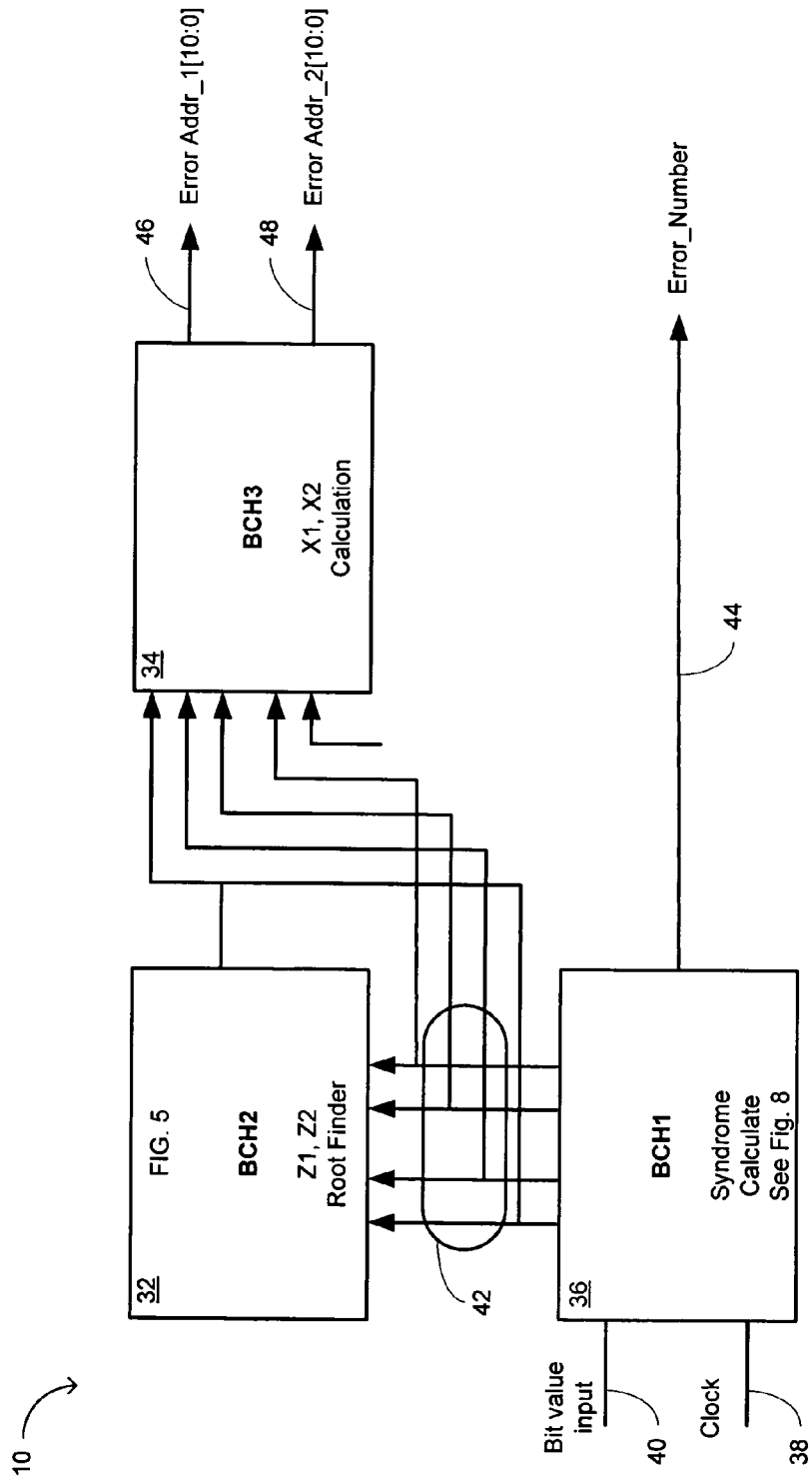
FIG. 3 shows further details of the decoder 10 of FIG. 1, in accordance with an embodiment of the present invention.

FIG. 3 shows further details of the decoder 10 of FIG. 1, in accordance with an embodiment of the present invention. In FIG. 3, the decoder 10 is shown to include a syndrome calculate block 36, a root finder block 32 and a polynomial calculator 34. The block 36 is shown to receive a clock signal 38 and a bit value input signal 40 and is operative to generate and couple a calculated syndrome onto the syndrome signals 42, which are received by the block 32 and the block 34. Further shown in FIG. 3 is the output of the block 32 serving as input to the block 34.

In FIG. 3, the block 36 is shown to generate an error number (Error_Number) signal 44, which is the signal 16 of FIG. 1 and the block 34 is shown to generate error addresses (ErrorAddr_1) signals 1 46 and (ErrorAddr_1) 2 48, which are the same as the signals 18 and 20 of FIG. 1, respectively.

Figure 4:
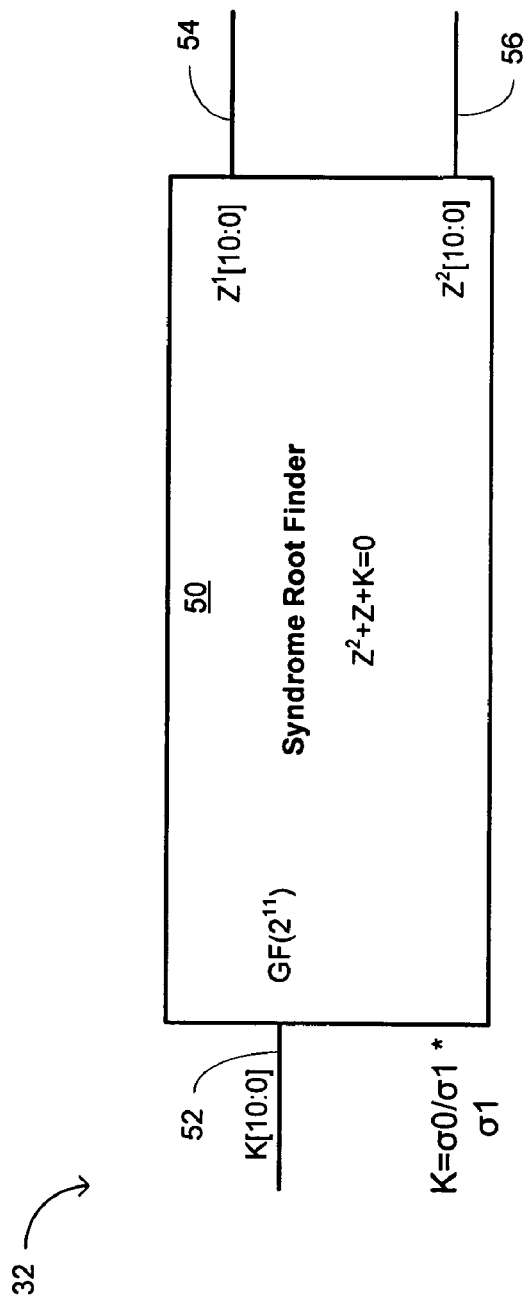
FIG. 4 shows an exemplary embodiment of the block 32, in accordance with an embodiment of the present invention.

FIG. 4 shows an exemplary embodiment of the block 32 wherein a syndrome root finder 50 is shown to receive a syndrome K, of 11 bits, on the syndrome signal 52 provided by the block 36 of FIG. 3 and is further shown to generate two roots, $Z^1$, generated onto the $Z^1$ signal 54 and $Z^2$, generated onto the $Z^2$ signal 56. Each of the roots, $Z_1$ and $Z_2$ are shown to be 11 bits, as denoted by $Z^1[10:0]$ and $Z^2[10:0]$, respectively and the syndrome K is shown to be 11 bits, as denoted by K[10:0] with the notation "[X:n]" generally being X-n in size. The signals 54 and 56 are each provided to the block 34. The example of FIG. 4 is carried through to subsequent figures to provide better understanding of additional details of the blocks of FIG. 3. In relation therewith, equations are presented below in a manner consistent with the figures. In one embodiment of the present invention, the finder 50 causes the following equation to be implemented:

$$Z^2 + Z + K = 0 \quad \text{Eq. (1)}$$

Figure 5A:
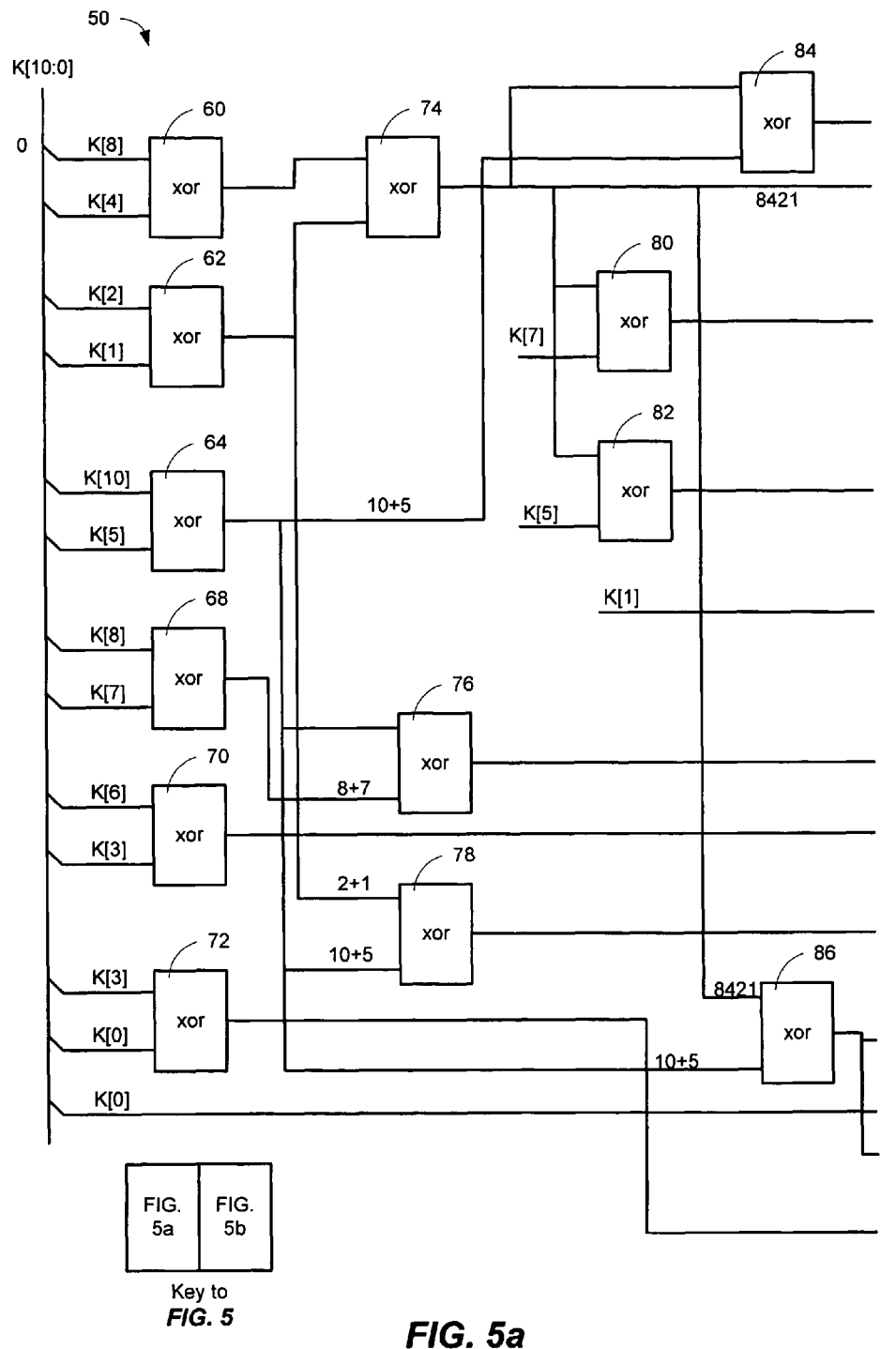
FIG. 5 shows further details of the block 50 of the example of FIG. 4.
Figure 5B:
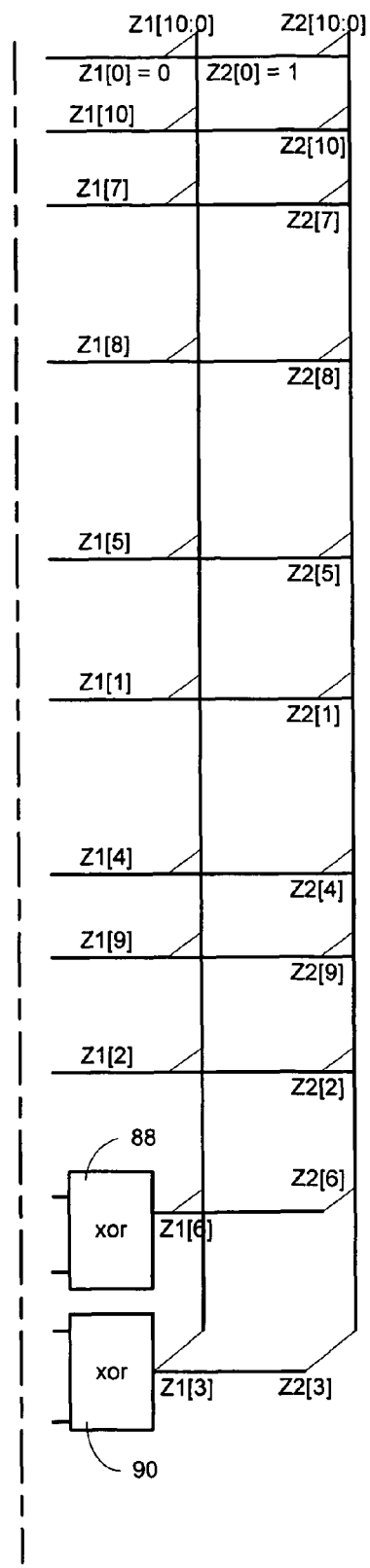
Figure 6A:
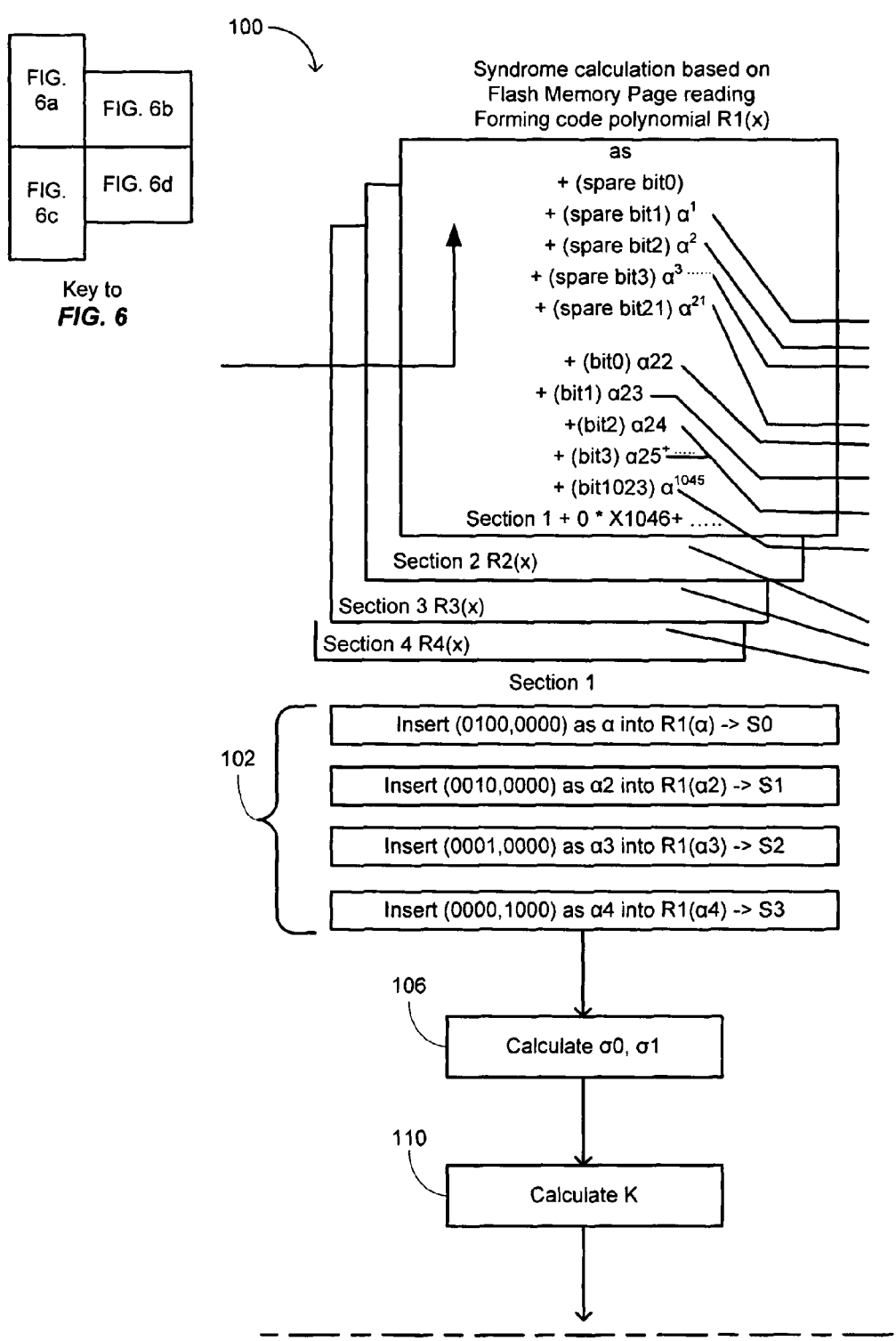
FIG. 6 shows a flow chart of the steps performed in recovering data, in accordance with one method of the present invention.
Figure 6B:
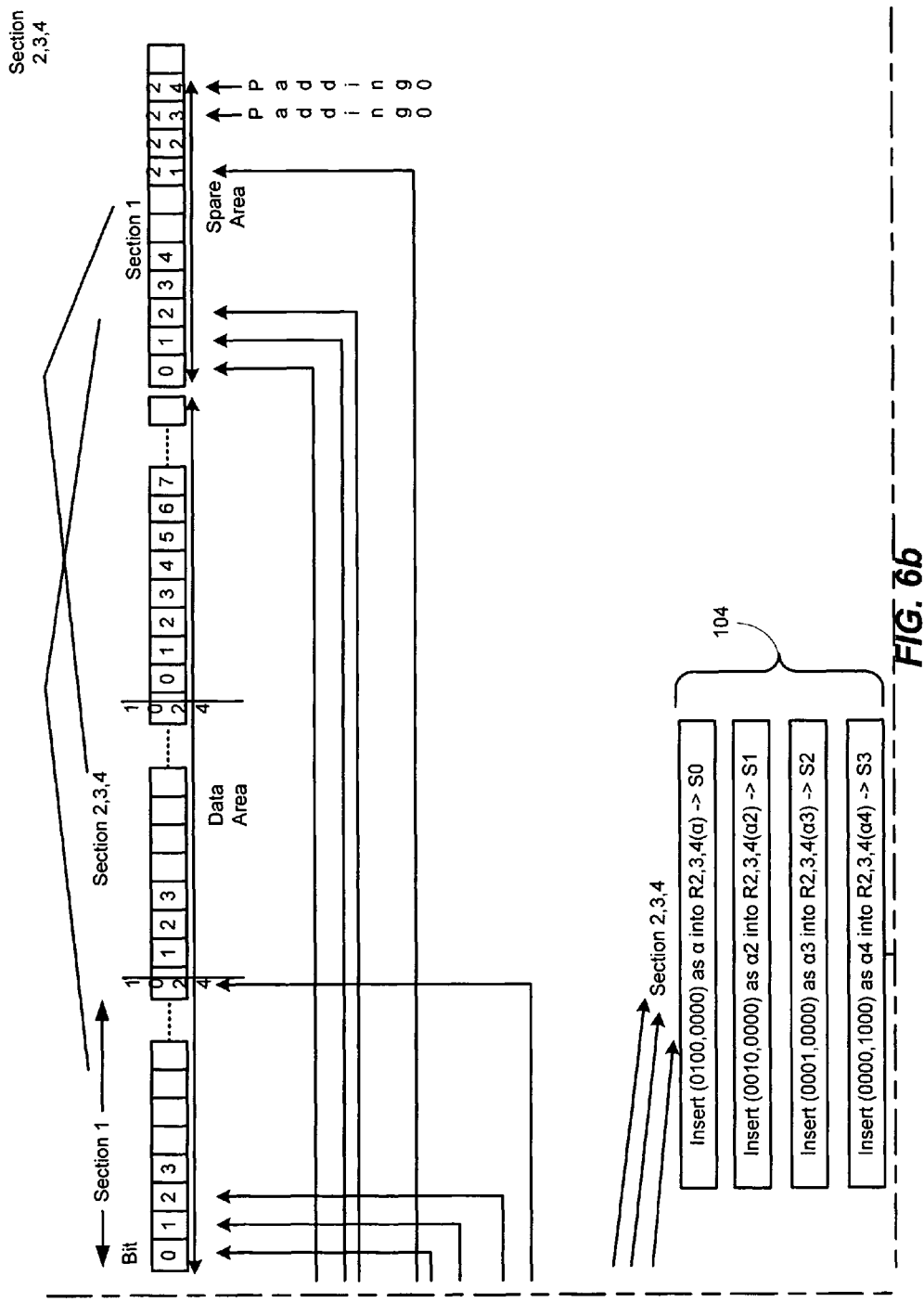
Figure 6C:
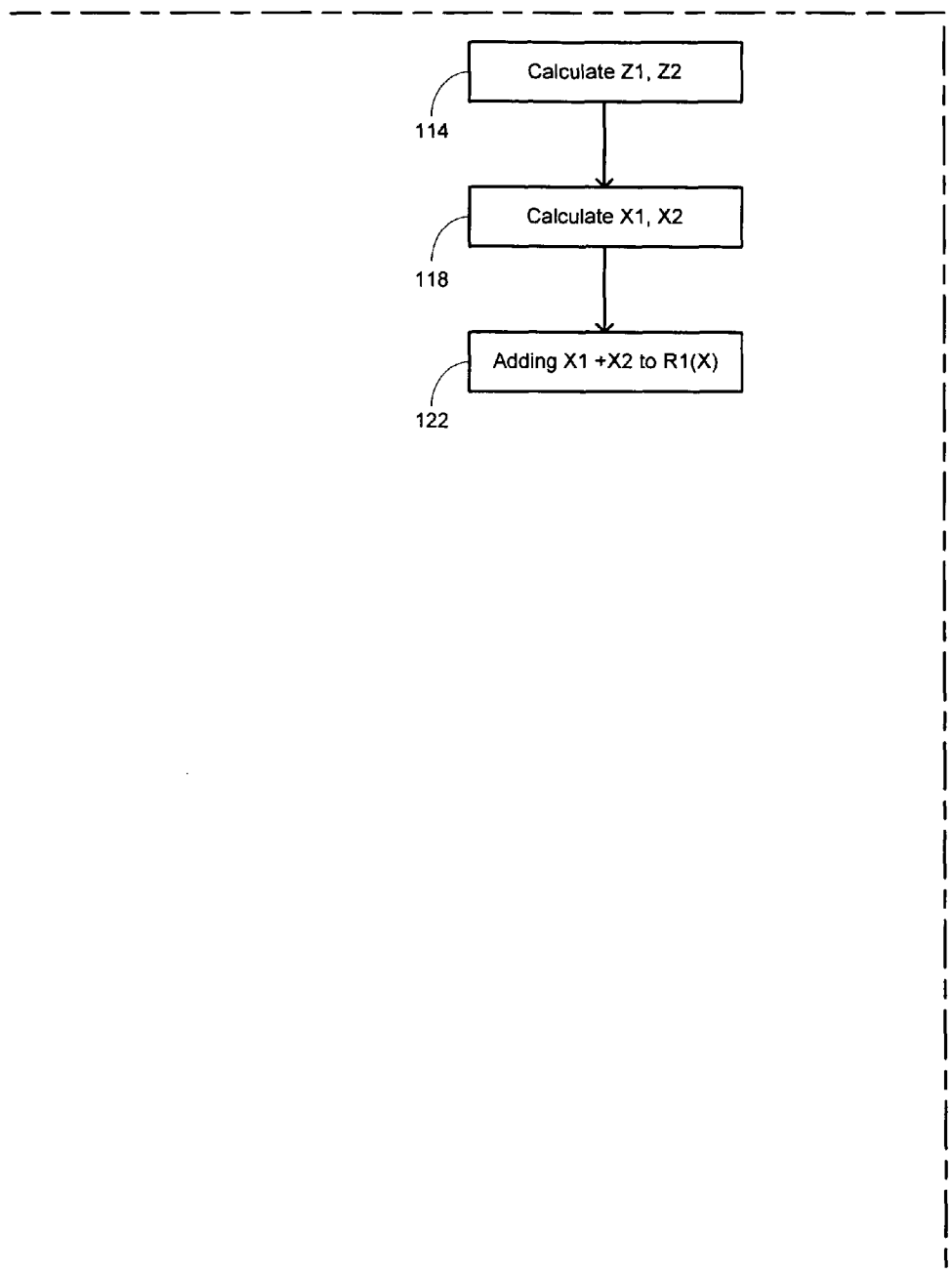
Figure 6D:
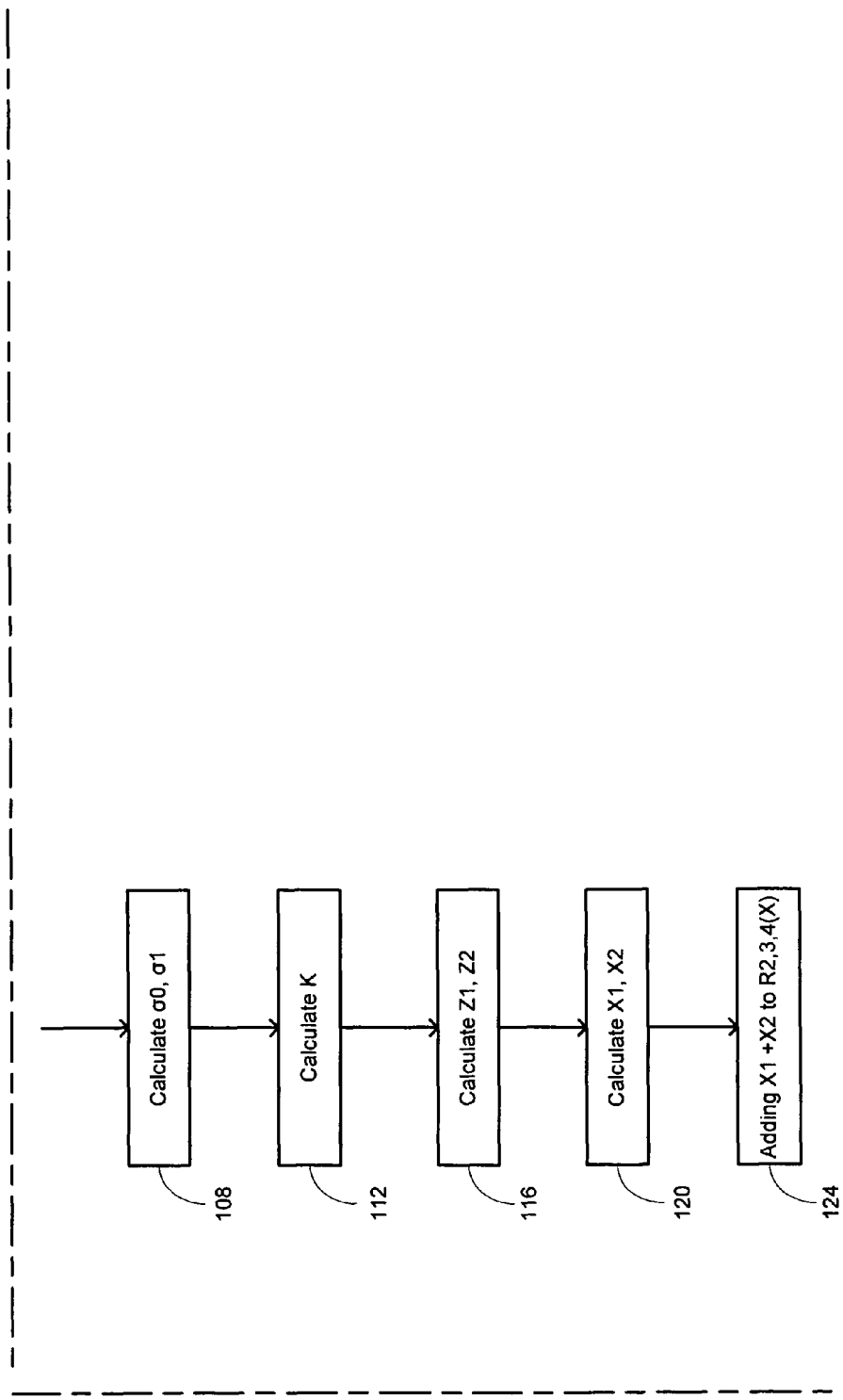

FIG. 5 shows further details of the block 50 of the example of FIG. 4. The block 50 is shown to include XOR blocks 60-90 for generating the two roots $Z_1$ and $Z_2$ onto the signals 54 and 56, respectively. The syndrome K[10:0] is received as previously noted and each of its bits are 'XOR'ed or compared to its other bits, in stages, in the manner shown in FIG. 5. For example, in the first stage of XORs, bits K[8] or the ninth bit of K are shown XORed with K[4] or the fifth bit of K. K[2] is shown XORed with K[1] and so on. The first stage of XORs is shown shown to include the XORs 60-72, the second stage of XORs is shown to include XORs 74-78, the third stage is shown to include XORs 80 and 82 and so forth. In a second stage of comparison, the outputs of the first stage of XORs are shown XORed to each other, in a manner consistent with that shown in FIG. 5. Some XORs beyond the first stage also compare a bit from K to the output of another XOR, for example, the XOR 80 is shown to compare the output of the XOR 74 to the K[7] or eighth bit of K. The finder 50 of FIG. 5 causes implementation of Eq. (1) and is an exemplary calculation of a Galois Field (GF) $(2^{11})$.

In the interest of further clarification, an example of error count using the finder 50 is now presented. The example is intended to be used for flash or non-volatile memory error recovery and in the case where a page is 1028 bits in length with a page being divided or organized into four sections, as previously discussed. Also, in this example, two errors (or error bits) are assumed to be present.

Assuming for the sake of an example, two error counts per code format BCH code are based on $GF(2^{11})$, the code length is BCH(128×8+11×2, 128×8) which (128×8+11×2) bits is code length to accommodate quarter flash memory page size 128 bytes plus 3 spare bytes, which is 11×2 bits (22 bits, less than 3 bytes) as the parity bits in the spare area of a sector or page. 11 is an example of the notation 'm' in GF $(2^m)$. 128 bytes is the length of message (or section) unit is read out as the code from the data area of a sector or page during the decoding period of a quarter of a page of flash memory, 3 bytes (actually 22 bits used, 2 bits are left to be zeroes) is the parity bytes generated from BCH encoder, which resides in spare areas per page of flash memory.

The reason 11 is chosen as the 'm' value in the GF $(2^m)$ is: $2^{11} = 2047$; and quarter of full page 512 bytes is 128 bytes; 128×8+11×2=1046; m=11 is the least number we can choose. Let us assume r(x) is the receiving polynomial, c(x) is the correct code word polynomial, e(x) is error polynomial, then $$r(x) = c(x) + e(x) \quad \text{Eq. (2)}$$

Since two error bits are assumed to be correctable by this BCH code, four syndromes $S_j$ (j=0, 1, 2, 3), also assume two error bit positions are $i_1$, $i_2$; and error bit values are $Y_1$, $Y_2$, which can be either 1 or 0;

$$S_j = \sum_{i=0}^{N-1} r_i (\alpha^j)^i \quad \text{Eq. (3)}$$

In this formula, $X_1 = \alpha^{i_1}$, $X_2 = \alpha^{i_2}$;

Error location polynomial $X_1 = \alpha^{i_1}$, $X_2 = \alpha^{i_2}$;

$$\sigma(x) = (x - X_1)^*(x - X_2) = x^2 + \sigma_1 x + \sigma_0; \quad \text{Eq. (4)}$$

with two roots being $X_1$ and $X_2$ and $\sigma$ being coefficients of polynomial;

$$\sigma_1 = X_1 + X_2; \sigma_0 = X_1 * X_2; \quad \text{Eq. (5)}$$

$$S_0 = X_1 + X_2 = \sigma_1; \quad \text{Eq. (6)}$$

$$S_1 = X_1^2 + X_2^2 = \sigma_1^2; \quad \text{Eq. (7)}$$

$$S_2 = X_1^3 + X_2^3 = S1 * \sigma 1 + S0 * \sigma 0; \quad \text{Eq. (8)}$$

$$S_3 = X_1^4 + X_2^4 = S_2 * \sigma_1 + S_1 * \sigma_0; \quad \text{Eq. (9)}$$

from above equations, $\sigma_1$ and $\sigma_0$ can be calculated $$\sigma_1 = (S_1 S_2 + S_0 S_3)/(S_1^2 + S_0 S_2); \quad \text{Eq. (10)}$$

$$\sigma_0 = (S_2^2 + S_1 S_3)/(S_1^2 + S_0 S_2); \quad \text{Eq. (11)}$$

Syndrome values $S_j$ can be obtained by substitute $\alpha$, $\alpha^2$, $\alpha^3$, $\alpha^4$ into r(x).

By substitute syndrome values into $S_j$ equation can obtain $\sigma_1$, $\sigma_0$. Solving error location polynomial equation $\sigma(x)$, the two roots of $\sigma(x)$ is the error bits might occur. r(x)+e(x) can recover the original c(x).

Another way to calculate syndrome is from minimal polynomial, Since primitive function is $x^{11} + x^2 + 1$, and $\alpha^{2047} = 1$;

$$m_1(x) = (x - \alpha)(x - \alpha^2)(x - \alpha^4)(x - \alpha^8)(x - \alpha^{16})(x - \alpha^{32}) \quad \text{Eq. (12)}$$

$$(x - \alpha^{64})(x - \alpha^{128})(x - \alpha^{256})(x - \alpha^{512})(x - \alpha^{1024}),$$

since $\alpha^{2048} = \alpha$ in $GF(2^{11})$; after polynomial $$= x^{11} + x^2 + 1;$$

expansion and simplification.

$$m_3(x) = (x - \alpha^3)(x - \alpha^6)(x - \alpha^{12})(x - \alpha^{24})(x - \alpha^{48}) \quad \text{Eq. (13)}$$

$$(x - \alpha^{96})(x - \alpha^{192})(x - \alpha^{384})$$

$$(x - \alpha^{768})(x - \alpha^{1536})(x - \alpha^{1025}),$$

since $\alpha^{6144} = \alpha 3$ $$= x^{11} + x^8 + x^5 + x^2 + 1;$$

If no error occur, then $$S_0 = S_1 = S_2 = S_3 = 0; \quad \text{Eq. (14)}$$

In the case where only a single bit error occurs and assuming the error location is at $i_1$, the error bit value is $Y_1$, which can be calculated as A, B, C value, as below:

$$A = S_1^2 + S_0 S_2; \quad \text{Eq. (15)}$$

$$B = S_1 S_2 + S_0 S_3; \quad \text{Eq. (16)}$$

$$C = S_2^2 + S_1 S_3; \quad \text{Eq. (17)}$$

Since $$S_0 = X_1 \neq 0; \quad \text{Eq. (18)}$$

$$S_1 = X_1^2 \neq 0; \quad \text{Eq. (19)}$$

$$S_2 = X_1^3 \neq 0; \quad \text{Eq. (20)}$$

$$S_3 = X_1^4 \neq 0; \quad \text{Eq. (21)}$$

all $S_i \neq 0$ Does not imply four error, but imply at least one error occurs.
But $X_1 = S_0$; from above simple derivation;

$$\sigma_1 = (S_1 S_2 + S_0 S_3)/(S_1^2 + S_0 S_2) \quad \text{Eq. (22)}$$
$$= X_1^5 + X_1^5 = 0 <= B;$$

$$\sigma_0 = (S_2^2 + S_1 S_3)/(S_1^2 + S_0 S_2) \quad \text{Eq. (23)}$$
$$= X_1^6 + X_1^6 = 0 <= C;$$

$$A = X_1^4 + X_1^4 = 0 <= A; \quad \text{Eq. (24)}$$

So if $A = B = C = 0$ means only one error occur in this case. And $\alpha^{X_1} = S_0(\alpha)$; (3)
If two errors happen in read data, and assume $i_1$, $i_2$ are the error locations.

$$S_0 = X_1^1 + X_2^1 = X_1 + X_2 \quad \text{Eq. (25)}$$

$$S_1 = X_1^2 + X_2^2 \neq 0; \quad \text{Eq. (26)}$$

$$S_2 = X_1^3 + X_2^3 \neq 0 \quad \text{Eq. (27)}$$

$$S_3 = X_1^4 + X_2^4 \neq 0 \quad \text{Eq. (28)}$$

$$A = S_1^2 + S_0 S_2 = (X_1^2 + X_2^2)^2 + (X_1 + X_2)(X_1^3 + X_2^3) \neq 0 \quad \text{Eq. (29)}$$

since any arbitrary number that is squared and add together is necessarily greater than zero, if $X_1$, $X_2$ are not zero two errors occur;

$$B = S_1 S_2 + S_0 S_3 \quad \text{Eq. (30)}$$
$$= (X_1^2 + X_2^2) * (X_1^3 + X_2^3) + (x_1 + X_2)(x_1^4 + x_2^4) \neq 0;$$

$$C = S_2^2 + S_1 S_3 = (X_1^3 + X_2^3)^2 + (X_1^2 + X_2^2)(X_1^4 + X_2^4) \neq 0; \quad \text{Eq. (31)}$$

Using cyclic characteristic of Galois Fields (GF), assume $$x = \sigma_1 * z \quad \text{Eq. (32)}$$

in order to make $\sigma(x) = x^2 + \sigma_1 x + \sigma_0$ simple, it is easier to obtain $$\sigma(z) = z^2 + z + K; \quad \text{Eq. (32A)}$$

where $K = \sigma_0/\sigma_1^2$
Once the root of above equation is found, error is recovered $$x = \sigma_1 * z \quad \text{Eq. (33)}$$

Again.
Roots of $\sigma(x)$ are error locations $X_1$, $X_2$, where the error bits location occur.
Most of the BCH decoding problems are finding these two roots that lead to error bit location.
In one embodiment of the present invention, requiring less hardware, the following is performed. Assume $Z_1$, and $Z_2$ are roots of $\sigma(z)$, $$Z_1^2 + Z_1 + K = 0; \quad \text{Eq. (34)}$$

$$Z_2^2 + Z_2 + K = 0; \quad \text{Eq. (35)}$$

Subtraction of the two equations Eq. (34) and Eq. (35) results in:

$$(Z_1^2 - Z_2^2) + (z_1 - Z_2) = 0, \quad \text{Eq. (36)}$$

in Galois field operation "−" is identical with "+",
And there is obtained $$(Z_1^2 + Z_2^2) + (Z_1 + Z_2) = 0, \quad \text{Eq. (37)}$$

since $$2 * Z_1 * Z_2 = Z_1 * Z_2 + Z_1 * Z_2 = 0; \quad \text{Eq. (38)}$$

and because two identical terms added together equal zero, under Galois operation, there is obtained, $(Z_1^2 + Z_2^2 + 2Z_1 * Z_2) + (Z_1 + Z_2) = 0$, $$(Z_1 + Z_2)^2 + (Z_1 + Z_2) = 0; \quad \text{Eq. (39)}$$

$$(Z_1 + Z_2) * (Z_1 + Z_2 + 1) = 0; \quad \text{Eq. (40)}$$

Which results in $Z_1 + Z_2 0$; or $$Z_1 + Z_2 + 1 = 0; \quad \text{Eq. (41)}$$

However $Z_1 = Z_2$ is not possible, as two error locations can not be same, thus, $$Z_1 = Z_2 + 1;$$

or $$Z_2 = Z_1 + 1;$$

or $$Z_1 + Z_2 = 1; \quad \text{Eq. (42)}$$

Three equations exist at the same time under Galois operation.
Also the number '1' in the Equations (41) and (42) in above equation means (100 0000 0000) if $GF(2^{11})$, we know $Z_1$ and $Z_2$ highest bit (bit position 0) should be opposite to each other.
Examples like $Z_1 = 011\ 1010\ 0110$; $Z_2 = 111\ 1010\ 0110$;
underline LSB bit toggle to each other according to above explanation.
Again $Z_1^2 + Z_1 + K = 0$;

$$Z_1 * (Z_1 + 1) + K = 0; \quad \text{Eq. (43)}$$

$$Z_1 * (Z_1 + 1) = K; \quad \text{Eq. (44)}$$

Assuming:

$$Z_1 = \beta_1 * \alpha + \beta_2 * \alpha^2 + \beta_3 * \alpha^3 + \beta_4 * \alpha^4 + \beta_5 * \alpha^5 + \quad \text{Eq. (45)}$$
$$\beta_6 * \alpha^6 + \beta_7 * \alpha^7 + \beta_8 * \alpha^8 + \beta_9 * \alpha^9 + \beta_{10} * \alpha^{10};$$

Then $$Z_1 + 1 = 1 + \beta_1 * \alpha + \beta_2 * \alpha^2 + \beta_3 * \alpha^3 + \beta_4 * \alpha^4 + \beta_5 * \alpha^5 + \quad \text{Eq. (46)}$$
$$\beta_6 * \alpha^6 + \beta_7 * \alpha^7 + \beta_8 * \alpha^8 + \beta_9 * \alpha^9 + \beta_{10} * \alpha^1;$$

$\beta_j$ is 1 or 0 only in above derivation, so equalities hold for $\beta_j * \beta_j = \beta_j$, $\beta_j + \beta_j = 0$.
(44), (45) These Two terms can be swapped without influence final result, Multiply two terms together, we get $$(\beta_{10}*\alpha^{20}+\beta_9*\alpha^{18}+\beta_8*\alpha^{16}+\beta_7*\alpha^{14}+\beta_6*\alpha^{12})$$
$$+(\beta_{10}+\beta_5)*\alpha^{10}+\beta_9*\alpha^9+(\beta_8+\beta_4)*\alpha^8$$
$$+\beta_7*\alpha^7+(\beta_6+\beta_3)*\alpha^6+\beta_5*\alpha^5+(\beta_4+\beta_2)*\alpha^4+\beta_3*\alpha_3+(\beta_2+\beta_1)*\alpha^2+\beta_1*\alpha=K; \quad\quad (46A)$$

Owing to the fact that $\beta_7*\beta_7=\beta_7$;
 Also $\beta_7*\beta_6+\beta_7*\beta_6=0$;
If Galois Field $GF(2^{11})$ is referenced, the following is found:
$\alpha^{11}=1+\alpha^2$; From generation polynomial $X^{11}+x^2+1$
$\alpha^{20}=(1010\ 0000\ 010)=1+\alpha^2+\alpha^9$;
$\alpha^{18}=(0000\ 0001\ 010)=\alpha^9+\alpha^7$;
$\alpha^{16}=(0000\ 0101\ 000)=\alpha^7+\alpha^5$;
$\alpha^{14}=(0001\ 0100\ 000)=\alpha^5+\alpha^3$;
$\alpha^{12}=(0101\ 0000\ 000)=\alpha+\alpha^3$;

$$[\beta_{10}*(1+\alpha^2+\alpha^9)+\beta_9*(\alpha^9+\alpha^7)+\beta_8*(\alpha^7+\alpha^5)+\beta_7*(\alpha^5+\alpha^3)+\beta_6*(\alpha+\alpha^3)]$$
$$+(\beta_{10}+\beta_5)*\alpha^{10}+\beta_9*\alpha^9+(\beta_8+\beta_4)*\alpha^8$$
$$+\beta_7*\alpha^7+(\beta_6+\beta_3)*\alpha^6+\beta_5*\alpha^5+(\beta_4+\beta_2)*\alpha^4+\beta_3*\alpha^3+(\beta_2+\beta_1)*\alpha^2+\beta_1*\alpha=K; \quad\quad \text{Eq. (46B)}$$

$$(\beta_{10}+\beta_5)*\alpha^{10}+\beta_{10}*\alpha^9+(\beta_8+\beta_4)*\alpha^8+(\beta_9+\beta_8+\beta_7)*\alpha^7+$$
$$(\beta_6+\beta_3)*\alpha^6+(\beta_8+\beta_7+\beta_5)*\alpha^5+(\beta_4+\beta_2)*\alpha^4+(\beta_7+\beta_6+\beta_3)*\alpha^3+$$
$$(\beta_{10}+\beta_2+\beta_1)*\alpha^2+(\beta_6+\beta_1)*\alpha+\beta_{10}=K; \quad\quad \text{Eq. (46C)}$$

Substitute these five values $\alpha^{12}, \alpha^{14}, \alpha^{16}, \alpha^{18}, \alpha^{20}$ into above equation, we find $$\beta_{10}+\beta_5=K_{10}; \quad\quad \text{Eq. (47)}$$

$$\beta_{10}=K_9;$$

$$\beta_8+\beta_4=K_8; \quad\quad \text{Eq. (48)}$$

$$\beta_9+\beta_8+\beta_7=K_7; \quad\quad \text{Eq. (49)}$$

$$\beta_6+\beta_3=K_6; \quad\quad \text{Eq. (50)}$$

$$\beta_8+\beta_7+\beta_5=K_5; \quad\quad \text{Eq. (51)}$$

$$\beta_4+\beta_2=K_4; \quad\quad \text{Eq. (52)}$$

$$\beta_7+\beta_6+\beta_3=K_3; \quad\quad \text{Eq. (53)}$$

$$\beta_{10}+\beta_2+\beta_1=K_2; \quad\quad \text{Eq. (54)}$$

$$\beta_6+\beta_1=K_1; \quad\quad \text{Eq. (55)}$$

$$\beta_{10}=K_0; \quad\quad \text{Eq. (56)}$$

$$K = \sigma_0/\sigma_1^2 \quad\quad \text{Eq. (57)}$$
$$= K_{10}*\alpha^{10}+K_9*\alpha^9+K_8*\alpha^8+K_7*\alpha^7+K_6*\alpha^6+$$
$$K_5*\alpha^5+K_4*\alpha^4+K_3*\alpha^3+K_2*\alpha^2+K_1*\alpha^1+K_0;$$

$K_j(j=10\ldots 0)$ are coefficient of 11 bit symbol value;
Substitute $\beta_{10}$ in Eq. (47), we get $$\beta_5=K_{10}+K_0; \quad\quad \text{Eq. (58)}$$

Adding (50) and (53), $$\beta_7=K_3+K_6; \quad\quad \text{Eq. (59)}$$

From Eq. (51), $$\beta_8+\beta_5=K_5+K_3+K_6;$$

From Eq. (53), $$\beta_6+\beta_3=K_5;$$

From Eq. (49), $$\beta_9+\beta_8=K_7+K_3+K_6;$$

From Eq. (51), $$\beta_8=K_5+K_{10}+K_0+K_3+K_6; \quad\quad \text{Eq. (60)}$$

From Eq. (48), $$\beta_4=K_5+K_{10}+K_0+K_3+K_6+K_8; \quad\quad \text{Eq. (61)}$$

From Eq. (52), $$\beta_2=K_4+K_5+K_{10}+K_0+K_3+K_6+K_8; \quad\quad \text{Eq. (62)}$$

From Eq. (54), $$\beta_1=K_2+K_4+K_5+K_{10}+K_0+K_6+K_8; \quad\quad \text{Eq. (63)}$$

From Eq. (55), $$\beta_6=K_1+K_2+K_4+K_5+K_{10}+K_3+K_6+K_8; \quad\quad \text{Eq. (64)}$$

From Eq. (53), $$\beta_3=K_3+K_1+K_2+K_4+K_5+K_{10}+K_8; \quad\quad \text{Eq. (65)}$$

After all $\beta_j$ are found, $Z_1$ is found, as we know from Eq. (41), $Z_2$ can also be found by adding 1 or (100 0000 0000) to it.
$X_1, X_2$ values are recovered by using Eq. (32), $$X_1=\sigma_1*Z_1; \quad\quad \text{Eq. (65)(a)}$$

$$X_2=\sigma_1*Z_2; \quad\quad \text{Eq. (65)(b)}$$

and $$e(x)=X_1+X_2; \quad\quad \text{Eq. (66)}$$

Correct code word c(x) can be obtained from Eq. (2) by adding r(x) and e(x).

As above explained, error locations $X_1, X_2$ need only be calculated from $K_j$, which is in turn coming from syndrome value $\sigma_0/\sigma_1^2$ with very simple exclusive operations. It does not need either ROM silicon which proportional to code size, or complex operation that requires lots of hardware for implementation.

Another easier approach for BCH application is using $GF(2^5)$ m=5 for theory verification, which limits total c(x) code to 31 bits, with double bits error correction capability. 10 bits is reserved for parity purpose, and 21 bits for message purpose. Same equation applies for error location polynomial, and two $\sigma_1*Z_1$, and $\sigma_1*Z_2$ roots finding can tell exactly where the errors will be.

Assume $$Z_1=\beta_1*\alpha+\beta_2*\alpha^2+\beta_3*\alpha^3+\beta_4*\alpha^4; \quad\quad \text{Eq. (67)}$$

Then $$Z_2 = Z_1 + 1 \quad\quad \text{Eq. (68)}$$
$$= 1 + \beta_1*\alpha + \beta_2*\alpha^2 + \beta_3*\alpha^3 + \beta_4*\alpha^4;$$

Multiply two terms together, we get $$(\beta_4*\alpha^8+\beta_3*\alpha^6)$$
$$+(\beta_2+\beta_4)*\alpha^4+\beta_3*\alpha^3+(\beta_2+\beta_1)*\alpha^2+\beta_1*\alpha=K; \quad\quad \text{Eq. (69)}$$

$\alpha^8=(1011\ 0)=1+\alpha^2+\alpha^3$;
$\alpha^6=(0101\ 0)=\alpha+\alpha^3$;
$\alpha^5=(0000\ 0101\ 000)=\alpha^2+1$; since generation polynomial is $X^5+X^2+1$ $\alpha^4 = (0000\ 1);$
$\alpha^3 = (0001\ 0);$
$\alpha^2 = (0010\ 0);$
$\alpha = (0100\ 0);$ $$(\beta_4*(1+\alpha^2+\alpha^3)+\beta_3*(\alpha+\alpha^3))$$
$$+(\beta_2+\beta_4)*\alpha^4+\beta_3*\alpha^3+(\beta_2+\beta_1)*\alpha^2+\beta_1*\alpha=K; \quad \text{Eq. (70)}$$

$$(\beta_2+\beta_4)*\alpha^4+\beta_4*\alpha^3+(\beta_4+\beta_2+\beta_1)*\alpha^2+(\beta_3+\beta_1)*\alpha+\beta_4=K; \quad \text{Eq. (71)}$$

$$\beta_2+\beta_4=K_4; \quad \text{Eq. (72)}$$

$$\beta_4+\beta_2+\beta_1=K_2; \quad \text{Eq. (73)}$$

$$\beta_3+\beta_1=K_1; \quad \text{Eq. (74)}$$

$$\beta_4=K_0; \quad \text{Eq. (75)}$$

We got $$\beta_2=K_4+K_0; \quad \text{Eq. (76)}$$

$$\beta_1=K_2+(K_4+K_0)+K_0=K_2+K_4; \quad \text{Eq. (77)}$$

$$\beta_3=K_1+K_2+K_4; \quad \text{Eq. (78)}$$

From above $Z_1$ and $Z_2$, we can find $X_1$ and $X_2$ also from $\sigma_1*Z_1$ and $\sigma_1*Z_2$, $$e(x)=X_1+X_2; \quad \text{Eq. (66)}$$

adding to r(x), c(x) is recovered, which is original encoded data from flash.

Assume 100_0001, is ASCII "A" representation, as correct message stored in flash memory, 10 bit parity code are stored in spare area for 2 bit error decoding purpose.

$$\text{Minimum polynomial } m_1(x)=m_2(x)= \quad \text{Eq. (79)}$$
$$m_4(x)=x^5+x^2+1=(x-\alpha)(x-\alpha^2)(x-\alpha^4)(x-\alpha^8)(x-\alpha^{16})$$

$$m_3(x)=x^5+x^4+x^3+x^2+1= \quad \text{Eq. (80)}$$
$$(x-\alpha^3)(x-\alpha^6)(x-\alpha^{12})(x-\alpha^{24})(x-\alpha^{17})$$

So $$g(x)=x^{10}+x^9+x^8+x^6+x^5+x^3+1; \quad \text{Eq. (81)}$$

if multiply $m_1(x)$ and $m_3(x)$.

| A correct code will be constructed as | |
|---|---|
| Message bits | Parity bits |
| 0 0000 0000 0100 0001 | 01, 1001, 0011 |

0 0000 0000 0100 0001 01 1001 0011 as correct code word c(x) shown above, which 10 bits in second column is parity bits by BCH encoder output, and 21 bits in first column that is message bits.

If this c(x) is fed into a circuit, $S_0(\alpha)=r(\alpha)=1+\alpha+\alpha^4+\alpha^7+\alpha^8+\alpha^{10}\alpha^{16}=0;$
$(10000)<-1$
$(01000)<-\alpha$
$(00001)<-\alpha^4$
$(00101)<-\alpha^7$
$(10110)<-\alpha^8$
$(10001)<-\alpha^{10}$
$(11011)<-\alpha^{16}$
$(00000)<-0$ $S_1(\alpha^2)=r(\alpha^2)=1+\alpha^2+\alpha^8+\alpha^{14}+\alpha^{16}+\alpha^{20}+\alpha=0;$
$S_2(\alpha^3)=r(\alpha^3)=1+\alpha^3+\alpha^{12}+\alpha^{21}+\alpha^{24}+\alpha^{30}+\alpha^{17}=0;$
$S_3(\alpha^4)=r(\alpha^4)=1+\alpha^4+\alpha^{16}+\alpha^{28}+\alpha+\alpha^{40}+\alpha^2=0;$ Since all syndrome values are zero, E_count=0; Error count is equal to zero;
Err_adr1=0; Err_adr2=0; There is no errors so all address indication is zero However if single error occurs, and assume 0 0000 0000 010 1 0001,01 1001 0011 is the r(x) received, bold and italic underlined 1 is error bit location, this information is fed into a circuit and there is obtained:

$$S_0(x)=r(x) \bmod m_1(x)=x^4+x^3+x^2+1 \quad \text{Eq. (82)}$$

$$S_1(x)=r(x) \bmod m_2(x)=x^4+x^3+x^2+1 \quad \text{Eq. (83)}$$

$$S_2(x)=r(x) \bmod m_3(x)=x^4+x+1 \quad \text{Eq. (84)}$$

$$S_3(x)=r(x) \bmod m_4(x)=x^4+x^3+x^2+1 \quad \text{Eq. (85)}$$

With mod being a modulo function $S_0(\alpha)=\alpha^4+\alpha^3+\alpha^2+1=\alpha^{14}$ from Eq. (82); or $S_0(\alpha)=r(\alpha)=\alpha^{16}+\alpha^{14}+\alpha^{10}+\alpha^8+\alpha^7+\alpha^4+\alpha+1=\alpha^{14};$ two equations end with same result even without minimal polynomial involved.
so location is $14^{th}$ bit error for r(x) received.
$S_1(\alpha^2)=\alpha^8+\alpha^6+\alpha^4+1;$
$S_2(\alpha^3)=\alpha^{12}+\alpha^3+1;$
$S_3(\alpha^4)=\alpha^{16}+\alpha^{12}+\alpha^8+1;$ $$A=S_1^2+S_0S_2=0 \quad \text{Eq. (15)}$$

$$B=S_1*S_2+S_0*S_3=0 \quad \text{Eq. (16)}$$

$$C=S_2^2+S_1S_3=0 \quad \text{Eq. (17)}$$

Can directly derive only one error that has occurred.
E_count=1;
Err_adr1=$S_0(\alpha)$=Loc 14;
Err_adr2=0;
Let bit position r(x) 14 invert, can recover the original c(x).
Also assuming two errors occurred in the following locations, designated in Italic and Bold notation:
0 0000 0000 0101 0001, 00 1001 0011 is the r(x) received, after circuit analysis, there is obtained:
$S_0(\alpha)=r(\alpha)=\alpha^{16}+\alpha^{14}+\alpha^{10}+\alpha^7+\alpha^4+\alpha+1=\alpha^4;$ (where $\alpha^{14}$ is the error term introduced from r(x) for example.)

$$S_1(\alpha^2)=r(\alpha^2)=\alpha+\alpha^{28}+\alpha^{20}+\alpha^{14}+\alpha^8+\alpha^2+1=\alpha^8;$$

$$S_2(\alpha^3)=r(\alpha^3)=\alpha^{17}+\alpha^{11}+\alpha^{30}+\alpha^{21}+\alpha^{12}+\alpha^3+1=\alpha^{25};$$

$$S_3(\alpha^4)=r(\alpha^4)=\alpha^2+\alpha^{25}+\alpha^9+\alpha^{28}+\alpha^{16}+\alpha^4+1=\alpha^{16};$$

$$\sigma_1=(S_1S_2+S_0S_3)/(S_1^2+S_0S_2)$$
$$=(\alpha^2+\alpha^{20})/(\alpha^{16}+\alpha^{29})=\alpha^3/\alpha^{30}=\alpha^4;$$

$$\sigma_0=(S_2^2+S_1S_3)/(S_1^2+S_0S_2)=(\alpha^{19}+\alpha^{24})/(\alpha^{16}+\alpha^{29})$$
$$=\alpha^{21}/\alpha^{30}=\alpha^{22};$$

$$K=\sigma_0/\sigma_1^2=\alpha^{22}/\alpha^8=\alpha^{14}=(10111); \text{(Note there are reverse permutated)}$$

$K_0$=1; $K_1$=0; $K_2$=1; $K_3$=1; $K_4$=1 from above K values; Substitute these $K_i$ values into FIG. 5 to obtain:
For $Z_1$, $\beta_4$=1, $\beta_3$=0, $\beta_2$=0, $\beta_1$=0 $\beta_0$=0; which is (00001)=$\alpha^4$,
And $Z_2$=(10001)=$\alpha^{10}$;
$X_1=\alpha^4*\alpha^4=\alpha^8;$ (From Eqs. (65A) and (65B), true root must multiply $\sigma_1$)
$X_2=\alpha^4*\alpha^{10}=\alpha^{14};$ Since A, B, C is not zero, it is implied that the error count is two.

E_count (error count)=2;

Err_adr1 (error address of first error)=0E;

Err_adr2 (error address of second error)=8; which identifies an error located in parity bits and from above X1 and X2 values, their position is irrelevant from values and can be exchanged.

Inverting two error bit locations of r(x), causes recovering the c(x), this is because BCH operates on bit errors instead of on symbol errors, inverting the position of r(x) can advantageously recover the original data.

The embodiments of the invention have various applications, among with which are memory system. On such application is in the integrated circuit card disclosed in a related application, i.e. U.S. Pat. No. 6,547,130, issued on Apr. 15, 2003, entitled "Integrated circuit card with fingerprint verification capability", the disclosure of which is incorporated herein as though set forth in full.

Exemplary implementation of the foregoing is shown relative to FIGS. 6-9. FIG. 6 shows a flow chart of the steps performed in recovering data, in accordance with one method of the present invention. At step 100, the syndrome is calculated based on a flash memory page that is read from flash memory to form the code polynomial $R_1(x)$. As previously noted, a page is sectioned into four units or sections. Next, at 102, the syndromes $S_0$-$S_3$ are calculated, for the first section of the page, by inserting the respective binary values, such as '0100,0000' for S0 and the like as α into $R_1(\alpha)$. Similarly, $S_0$-$S_3$ for the remaining sections of the page are calculated at step 104.

After step 102, $\sigma_0$ and $\sigma_1$ are calculated from the syndromes $S_0$-$S_3$, in accordance with the foregoing equations, for the first section, at step 106 and similarly, at step 108, the $\sigma_0$ and $\sigma_1$ are calculated from the syndromes $S_0$-$S_3$, in accordance with the foregoing equations, for the three remaining sections of the page, at step 108 after step 104.

After the step 106, K is calculated, at step 110, based on the foregoing equations, for the first section and after the step 108, K is calculated, at step 112, after the step 108, for the remaining three sections.

After the step 110, $Z_1$ and $Z_2$ are calculated, for the first section of the page, at step 114, based on the foregoing equations, for the first section and are used to calculate $X_1$ and $X_2$, at step 118 after which, at step 122, $X_1$ and $X_2$ are given a value '1' and/or added together and then XORed with $R_1(x)$ to recover the original values. X1 and X2 are error locations, and if a value of 1 is placed in the error location and ORed together as e(x), the error location polynomial, and then XORed with R1(x), the first 128 byte of data, i.e. the first data segment, is recovered.

After the step 112, $Z_1$ and $Z_2$ are calculated, for the remaining three sections of the page, at step 116, based on the foregoing equations, and are used to calculate $X_1$ and $X_2$, at step 118 after which, at step 124, $X_1$, $X_2$ are (same as above said) XOR to $R_{2,3,4}(x)$, and recover $2^{nd}$, $3^{rd}$ and $4^{th}$ 128 byte data sectors.

Figure 7B:
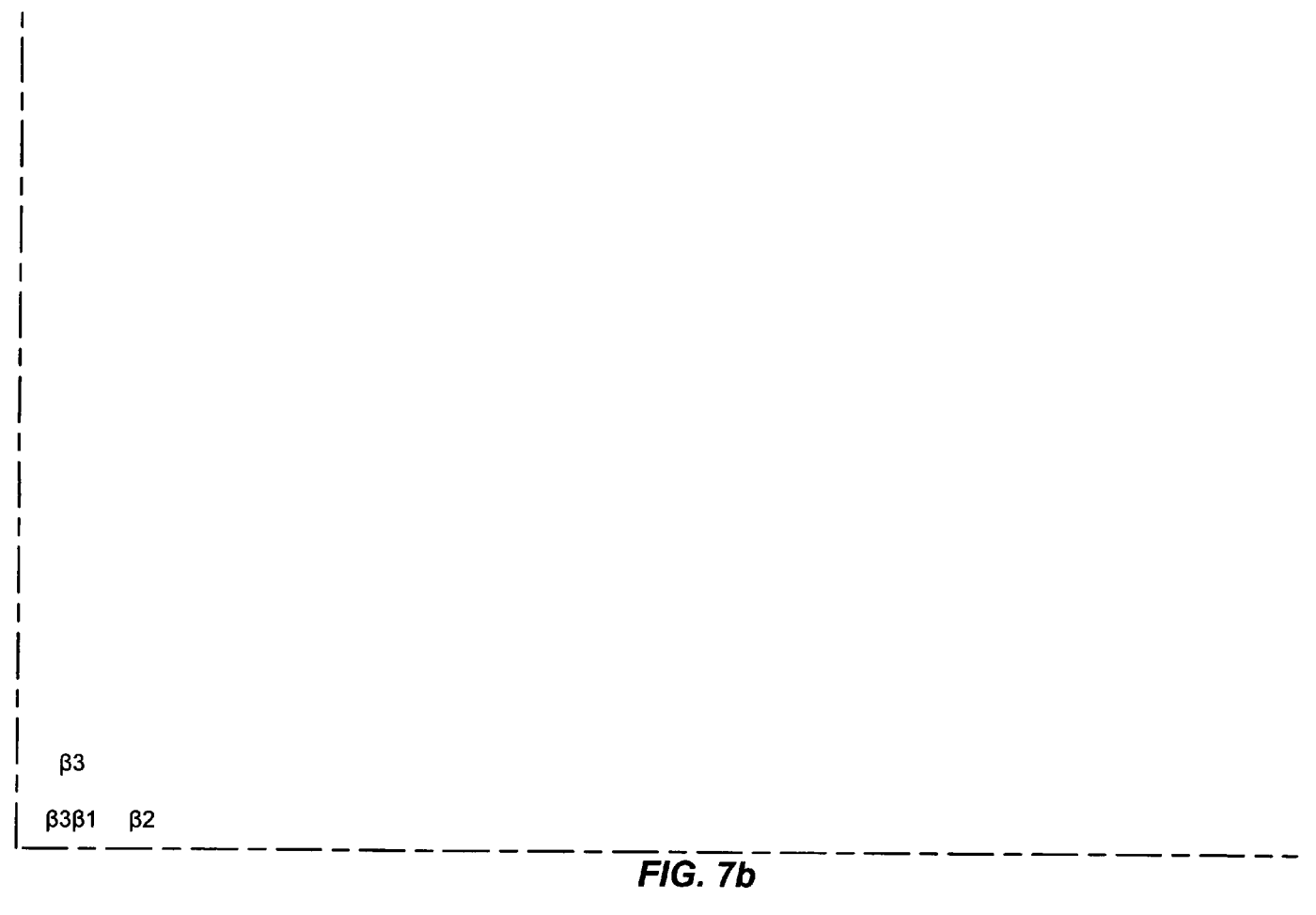
Figure 7D:
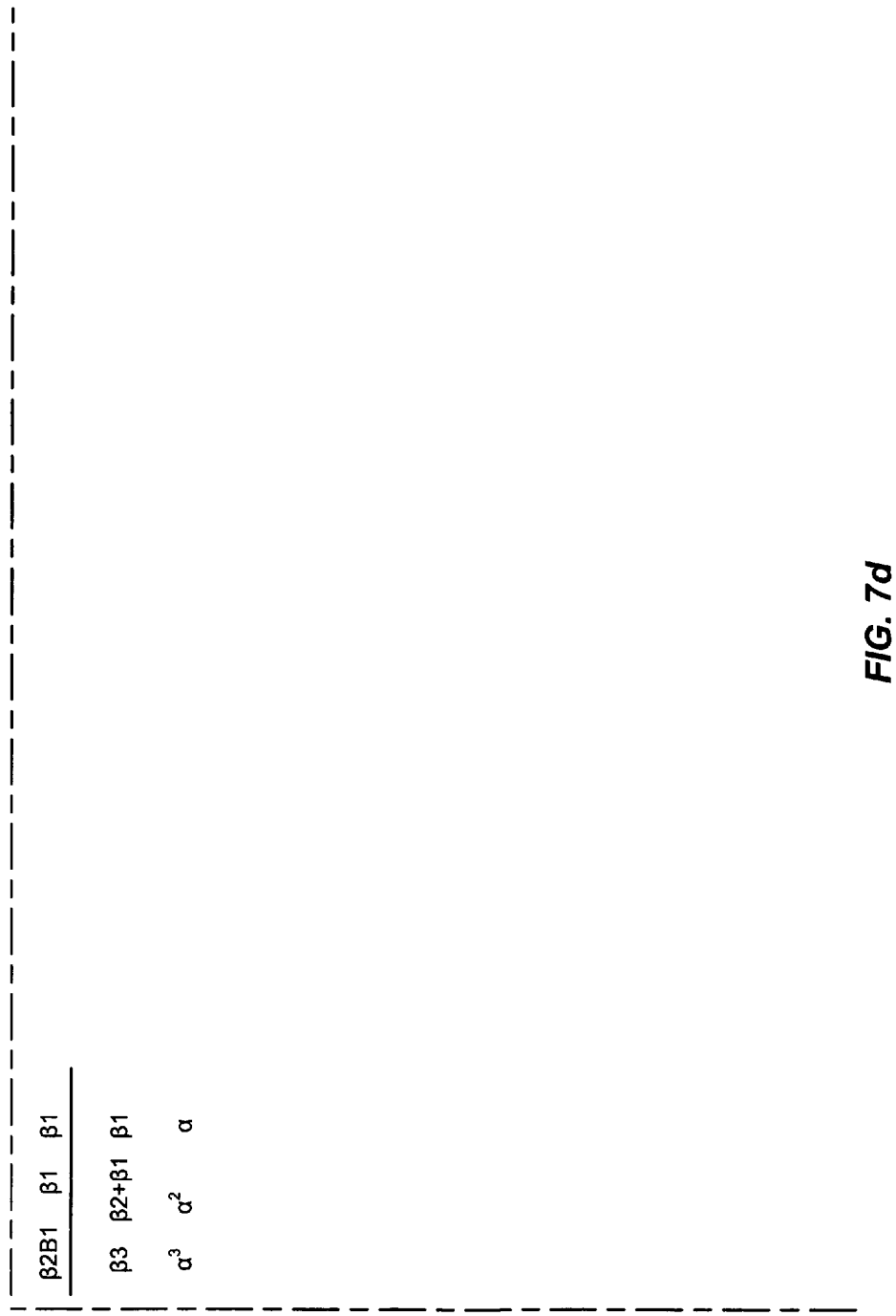
FIG. 7 shows a calculation or implementation of the Eq. (46) hereinabove.
Figure 8:
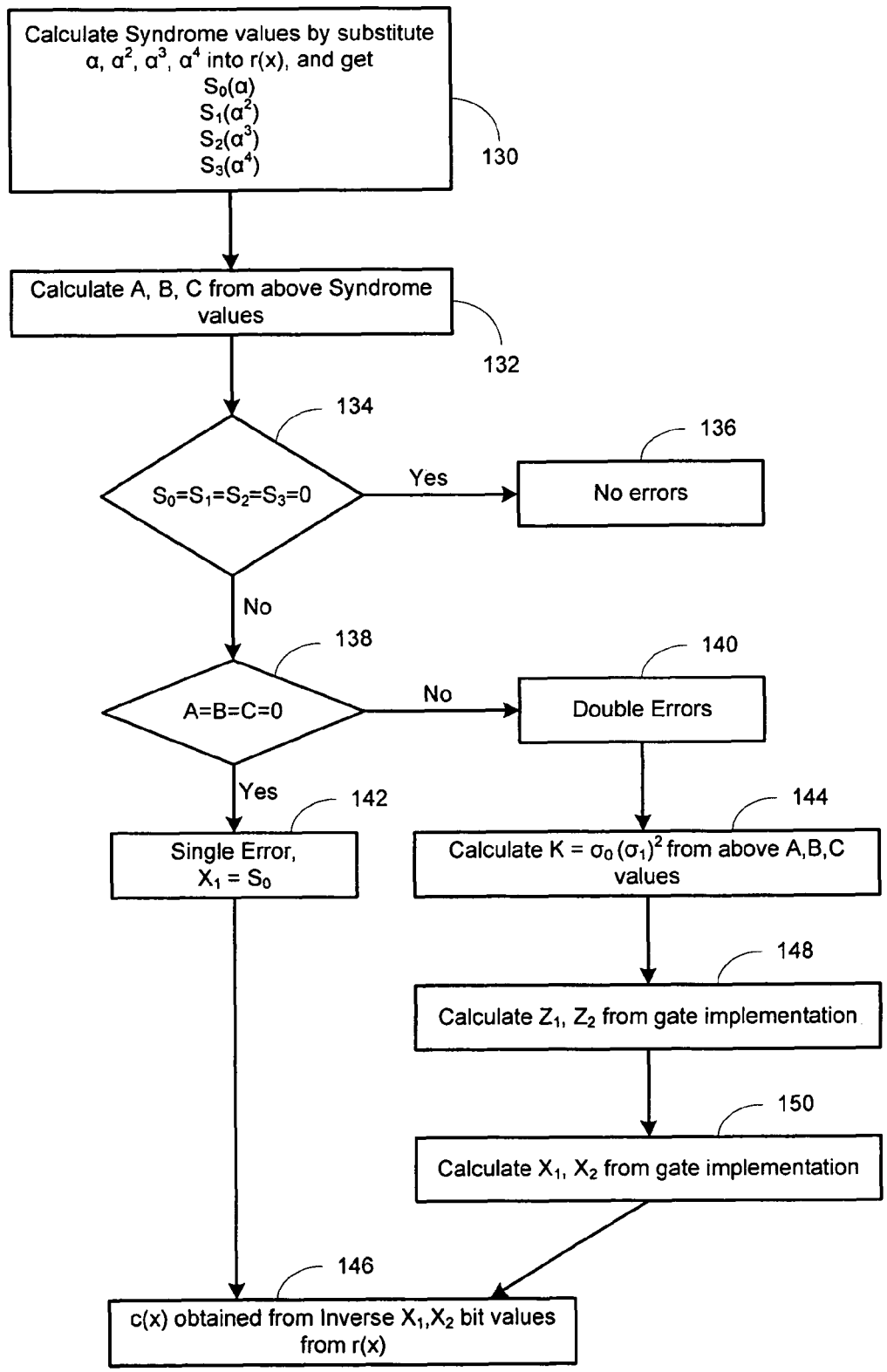
FIG. 8 shows a flow chart of the steps performed in performing BCH error correction of flash memory, in accordance with an embodiment of the present invention.
Figure 9B:
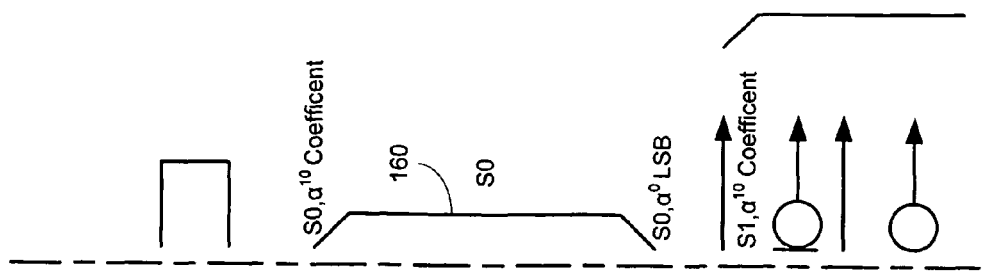
FIG. 9 shows a syndrome logic circuit 153 for generating S0, S1, S2 and S3 (syndromes of the four sections of a page in flash memory), in accordance with an embodiment of the present invention.
Figure 9C:
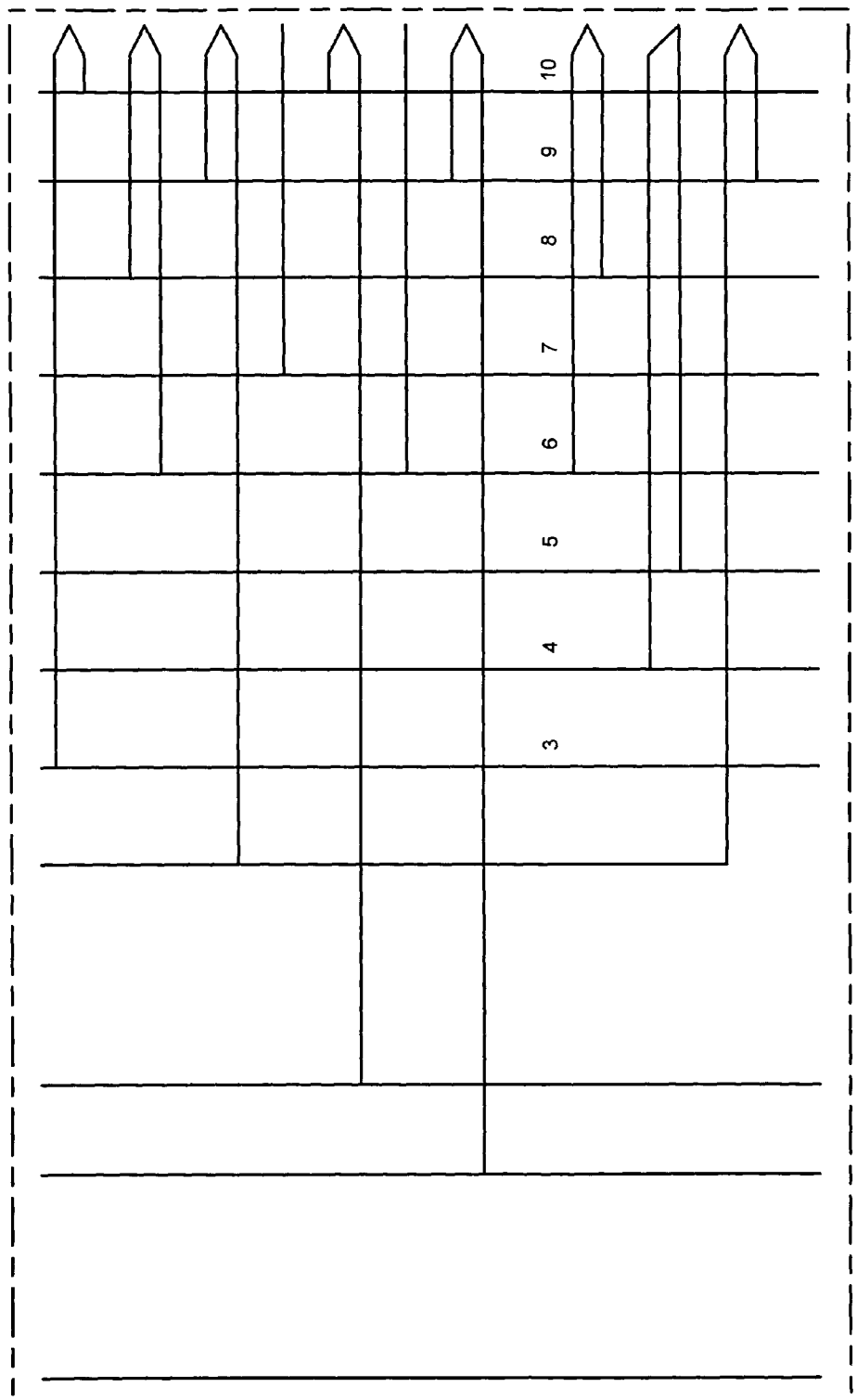
Figure 9D:
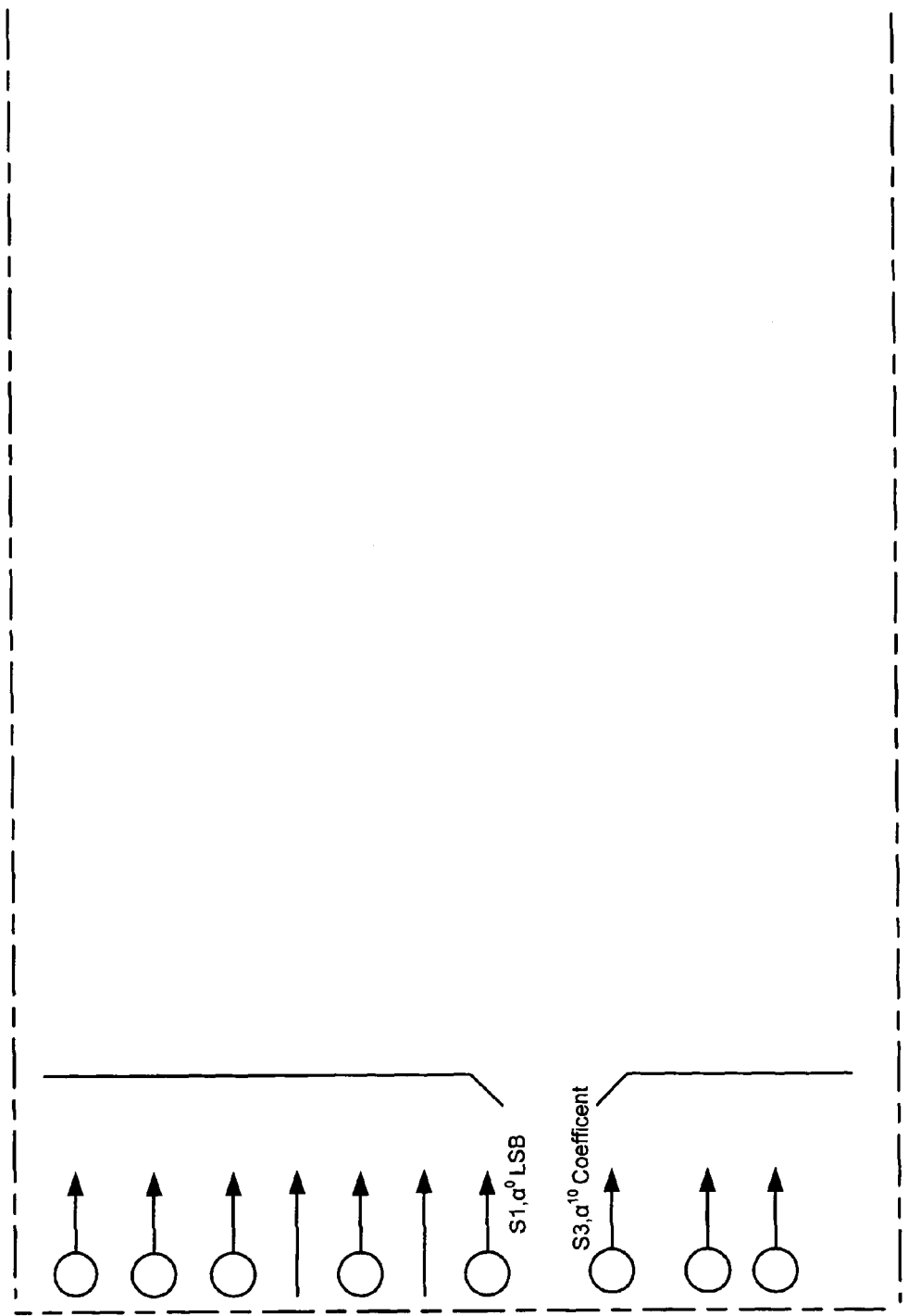
Figure 9E:
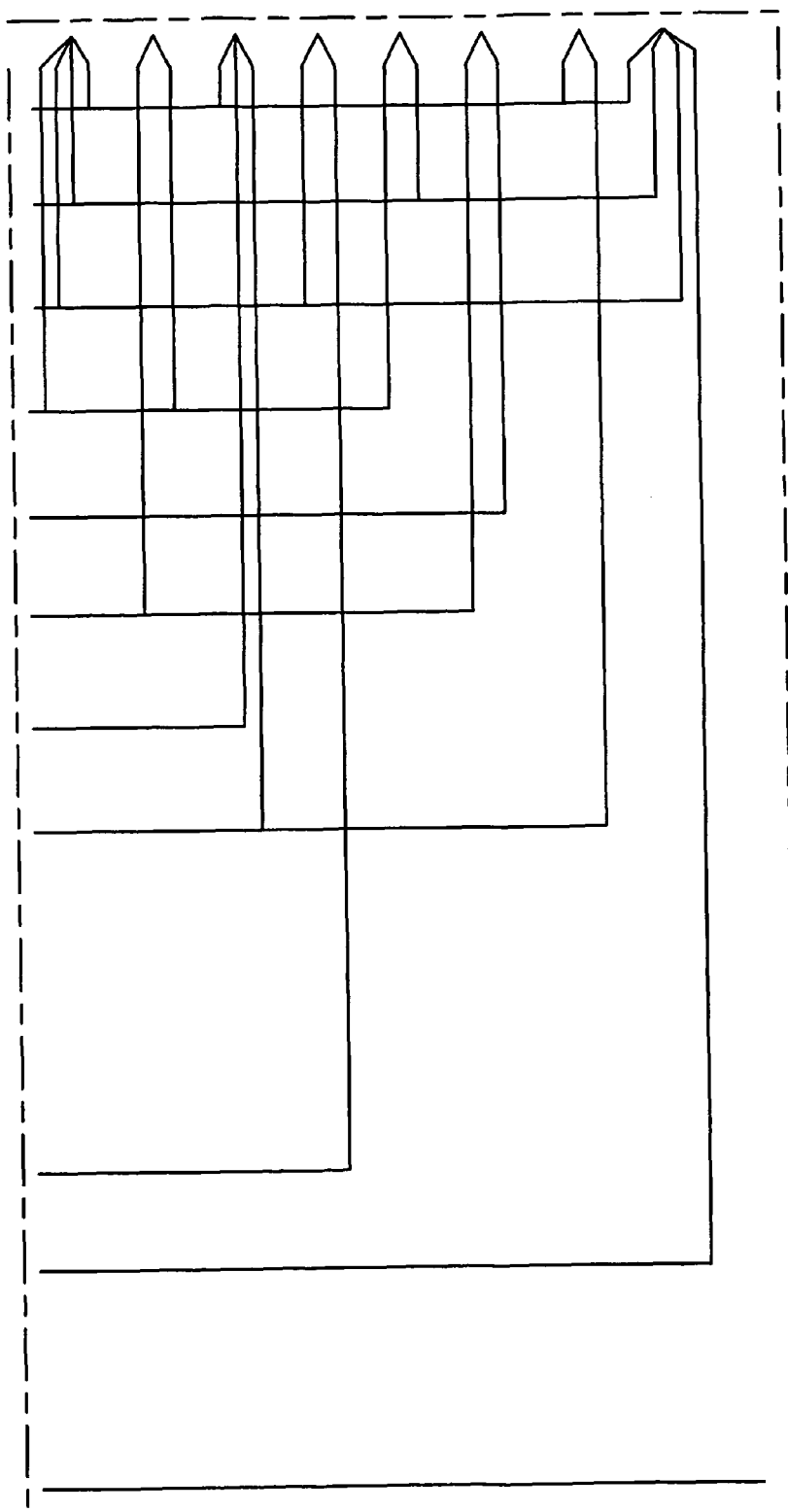
Figure 9F:
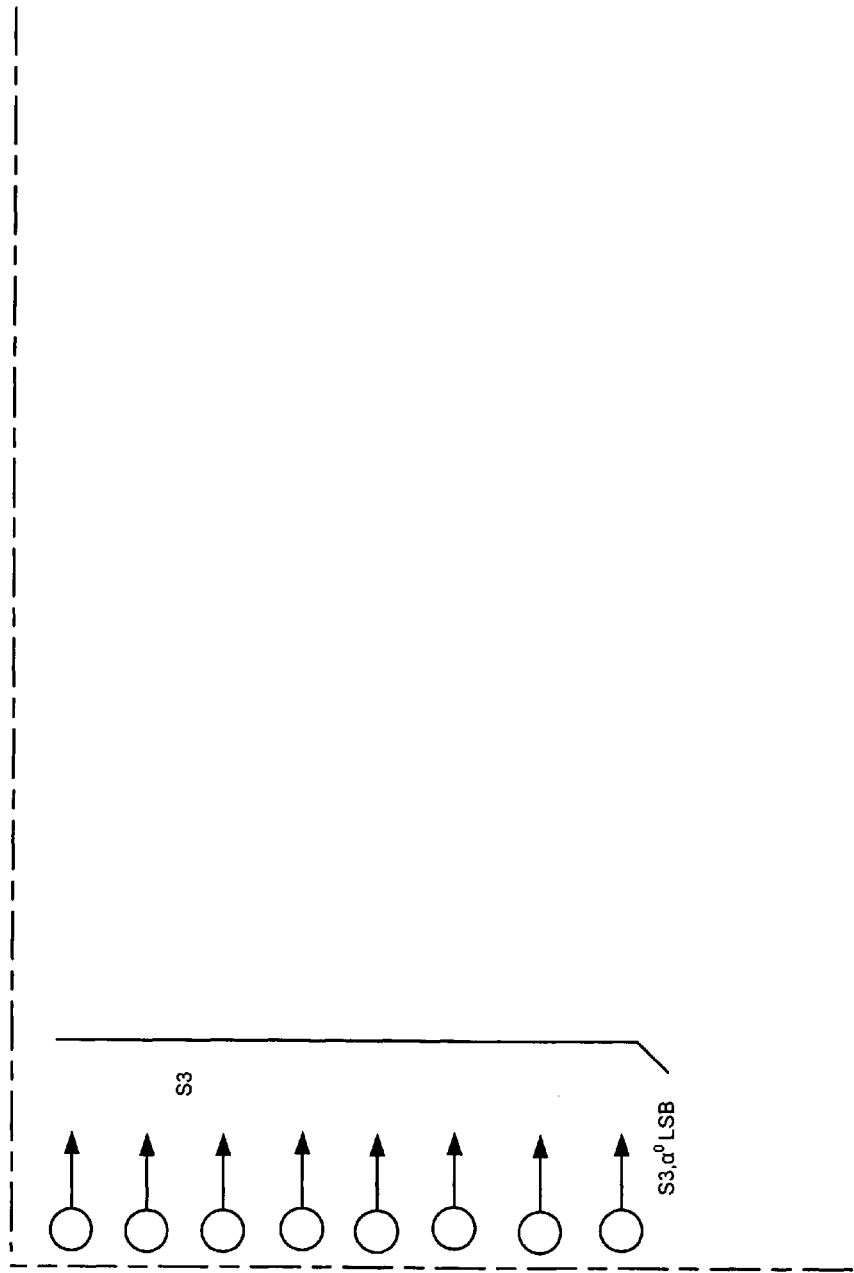
Figure 9G:
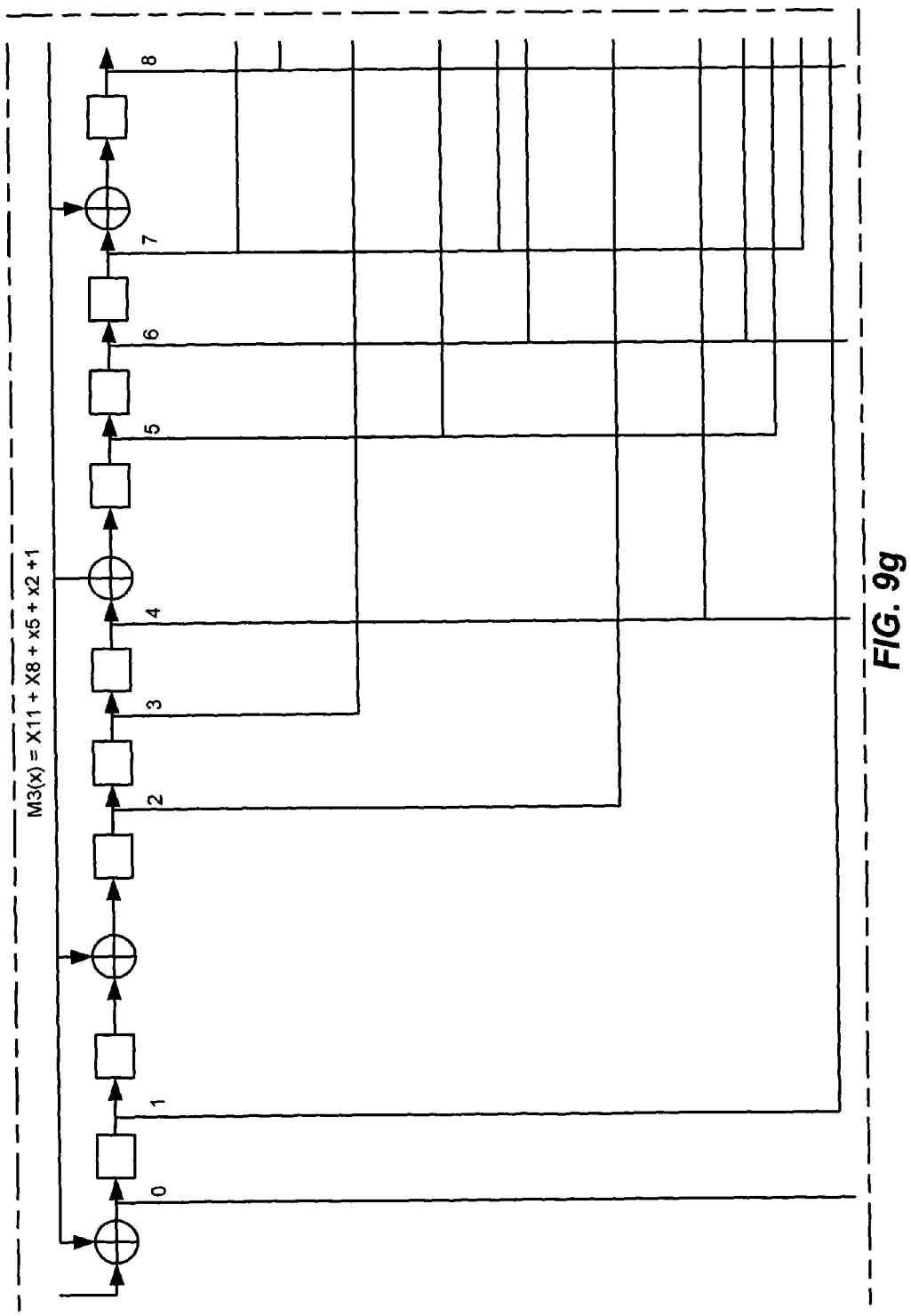
Figure 9H:
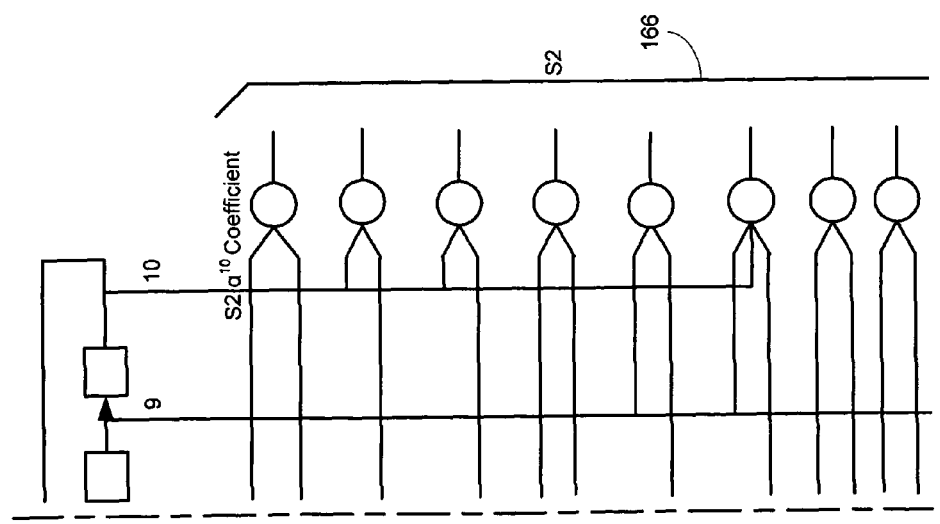
Figure 9I:
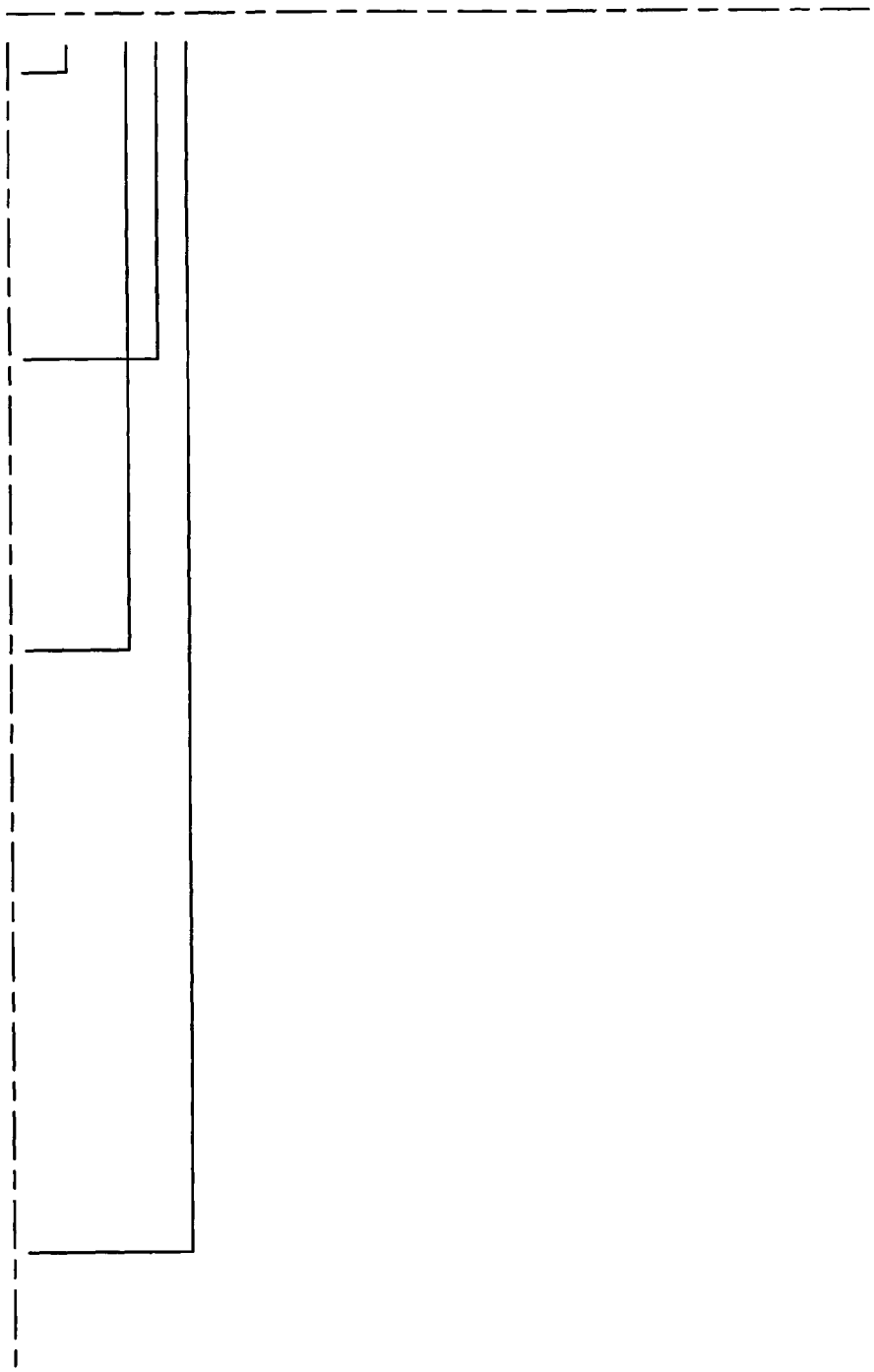
Figure 9J:
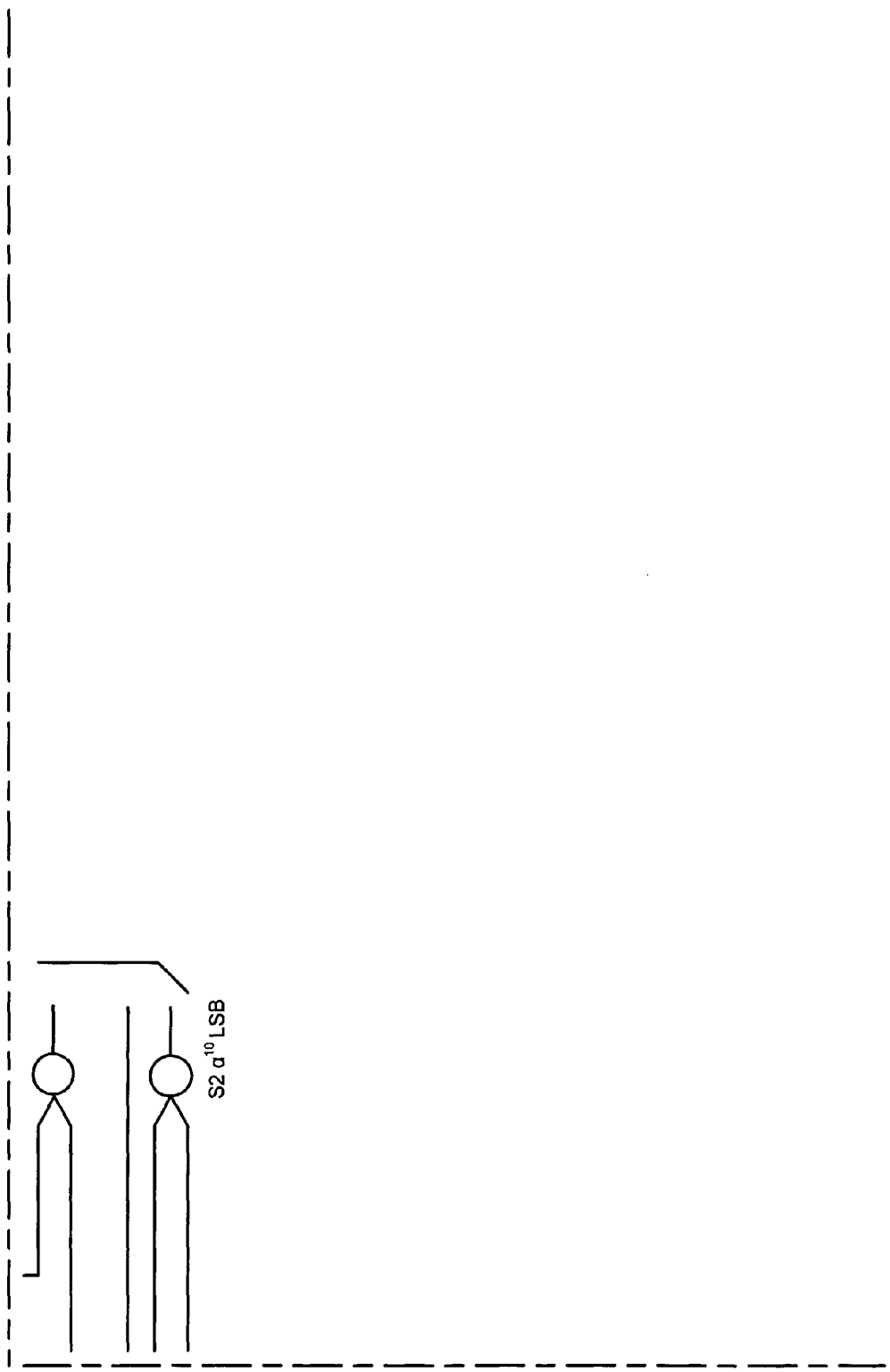

FIG. 7 shows a calculation or implementation of the Eq. (46) hereinabove. FIG. 8 shows a flow chart of the steps performed in performing BCH error correction of flash memory, in accordance with an embodiment of the present invention. At step 130, in FIG. 8, the syndrome values are calculated by substituting σ, $\sigma_1$, $\sigma_2$ and $\sigma_3$ into R(x) and obtaining $S_0(\alpha)$, $S_1(\alpha)$, $S_2(\alpha)$ and $S_3(\alpha)$, respectively. It should be noted that there are four syndromes because there are four segments or sections in each page, as earlier noted.

Next, at step 132, A, B and C values are calculated from the calculated syndrome values of step 130 and in accordance with Eqs. (15) through (17), respectively. Next, at 134, it is determined whether the syndromes $S_0(\alpha)$, $S_1(\alpha)$, $S_2(\alpha)$ and $S_3(\alpha)$ are all equal to one another and if so, no error is detected at 136. If at 134, it is that the syndromes are not equal to each other, another determination is made at 138 as to whether A, B and C are equal to each other and if it is determined that they are not, at step 140, two errors are detected. After step 140, at step 144, K is calculated as $\sigma_0/(\sigma_1)^2$ from A, B and C values. Next, at step 148, $Z_1$ and $Z_2$ are calculated, pursuant, for example, to the circuits of FIG. 5 and next, $X_1$ and $X_2$ are calculated in accordance with Eq. (65)(a) and Eq. (65)(b), respectively. Next, at step 146, c(x) is obtained from performing an inversing operation of $X_1$ and $X_2$ bit values from r(x), pursuant to c(x)=r(x)+e(x) and e(x), the error polynomial, being the $X_1$ $X_2$ positions with value of 1 in this polynomial and ORed together to form e(x), in accordance with Eq. (66) and r(x) being calculated in accordance with Eqs. (82) through (85). X1 and X2 are two error locations, in the foregoing example and they are 8 and 14(0xE), e(x) will have two 1s in positions 14 and 8, so if r(x) is inverted, bits 8 and 14 are used to recover the correct error value.

At 138, if it is determined that A, B and C values are not equal, the process continues to step 142 where a single error is detected and $X_1$ is set equal to $S_0$. After step 142, step 146 is performed.

FIG. 9 shows a syndrome logic circuit 153 for generating S0, S1, S2 and S3 (syndromes of the four sections of a page in flash memory), in accordance with an embodiment of the present invention. The circuit 153 is shown to include an input register 152 responsive to receiving one fourth of a page of bits from flash memory at 151, storing and providing the same to an XOR 156, which receives another input from the output of a certain operation, i.e. $x_{11}+x_2+1$ (shown equal to $m_1(x)$). The circuit 153 is shown to further include shift registers 154, each placed adjacent to the other or adjacent to an XOR, such as the XOR 156. The XORs perform a compare or add operation and the each of the shift registers 154 shifts has the effect of delaying a bit by one clock cycle. For example, $X_{11}$ is derived by shifting a received bit 11 times, thus, there are 11 shift register 154 between the XOR 156 and the output of the last shift register 154 that serves as one of the inputs of the XOR 156. Similarly, the two shift registers 154 between the XOR 156 and the XOR 158 implement the X2.

The shift registers 154 and the XORs 156 and 158, shown coupled in a manner consistent with that of FIG. 9, generate the syndromes $S_0$, $S_1$, $S_2$ and $S_3$, used for each of the four segments (or sections) of a page. Each segment of a page is 128 bytes, in the foregoing example thus, the embodiment of FIG. 9 is duplicated four times (or pipelined to save logic). Each of the 128 bytes needs to be fed or input pipelined at the scheduled time to avoid collision of pages. Each page is divided into four independent sections with 128 bytes in each section, for purpose of saving hardware, each section is timely scheduled to be calculated and pipelined by adding some latency overhead. $S_0$ is shown at 160, $S_1$ is shown at 162, $S_3$ is shown at 164 and S2 is shown at 166. $S_2$ is generated by implementing the equation $X_{11}+X_8+X_2+1$ (to generate $m_3(x)$). Syndromes $S_0$, $S_1$, and $S_3$ are generated using $m_0(x)$, $m_1(x)$ and $m_3(x)$ to generate, S0(x)=r(x) mod $m_0(x)$;
S1(x)=r(x) mod $m_1(x)$;
S3(x)=r(x) mod $m_3(x)$;
$S_2(x)$=r(x) mod $m_2(x)$; in this example, m=11, $m_0=m_1=m_3=X^{11}+X^2+1$, but $M_2=X_{11}+X_8+X_2+1$; this is the reason for $S_2$ being generated differently, as shown in FIG. 9 than $S_0$, $S_1$ and $S_2$ generation. Also α is fed into $S_0$, $α^2$ is fed into $S_1$, $α^3$ is fed into $S_2$, and $α^4$ is fed into $S_3$. "mod" is an abbreviation for a modulo operation. m0(x) through m3(x) are calculated in accordance with Eqs. (79) and (80).

Figure 10:
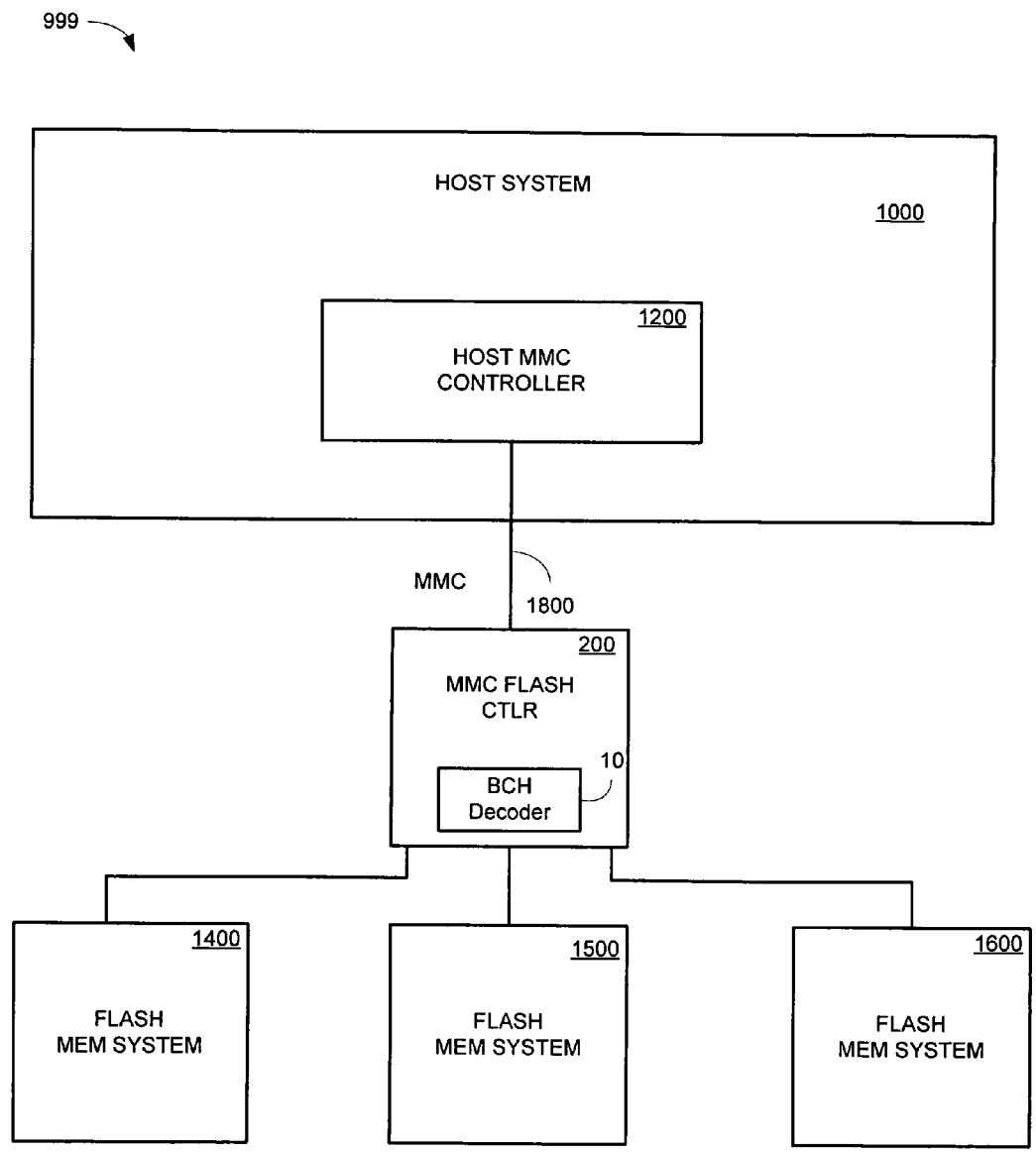
FIG. 10 shows an exemplary application of the BCH decoder 10 in accordance with an embodiment of the present invention.

The BCH decoder 10, shown in FIGS. 1-9, may be employed in various applications employing non-volatile or flash memory. In accordance with an exemplary application thereof is shown in FIG. 10. In FIG. 10, a non-volatile memory system 999 is shown to include a host system 1000 shown coupled through an MMC bus 1800 to an MMC flash controller 200, which is shown coupled to three flash memory systems 1400, 1500 and 1600 although any other number of flash memory system may be employed, in accordance with an embodiment of the present invention.

The host system 1000 is shown to include a host MMC controller 1200, which couples the host system 1000 to the controller 200. The host system 1000 stores or retrieves information into and from the flash memory system 1400-1600 through the controller 200. However, as previously noted, the retrieved information may include errors, thus, the BCH decoder, determines the number of errors and locates the errors with in a page of information stored in the flash memory systems, in a manner consistent with the foregoing FIGS. 1-9 and discussion related thereto.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A non-volatile memory device comprising:
   a Bose, Ray-Chaudhuri, Hocquenghem (BCH) decoder including,
      a syndrome calculator responsive to a page of information, the page including data and overhead, the data being organized into a plurality of data sections and the overhead being organized into a plurality of overhead sections, the syndrome calculator operative to generate a syndrome for each of the data sections;
      a root finder coupled to receive the calculated syndrome and operative to generate at least two roots; and
      a polynomial calculator responsive to the at least two roots and operative to generate at least two error addresses, each identifying a location in the data wherein the error lies,
   wherein the plurality of data sections is four sections and the root finder generates the at least two roots, $Z_1$ and $Z_2$, based upon a Galois Field (GF) ($2^{11}$) calculation.

2. A non-volatile memory device, as recited in claim 1, wherein the root finder generates the at least two roots, $Z_1$ and $Z_2$, based upon the following equations:

$$Z_1^2 + Z_1 + K = 0$$

and $$Z_2^2 + Z_2 + K = 0,$$

wherein 'K' represents a syndrome.

3. A non-volatile memory device, as recited in claim 1, wherein the root finder includes comparison logic for generating the at least two roots.

4. A non-volatile memory device, as recited in claim 1, wherein the comparison logic is made of a plurality of XOR.

5. A non-volatile memory device, as recited in claim 1, wherein the syndrome calculator includes combinatorial shift and comparison logic for generating each syndrome.

6. A non-volatile memory system comprising:
   a host system;
   at least one flash memory system coupled to store information from the host system; and
   an flash controller coupled between the host system and the at least one flash system for transferring information, organized into pages, between the host system and the flash system and including,
      a Bose, Ray-Chaudhuri, Hocquenghem (BCH) decoder including,
         a syndrome calculator responsive to a page of information, the page including data and overhead, the data being organized into a plurality of data sections and the overhead being organized into a plurality of overhead sections, the syndrome calculator operative to generate a syndrome for each of the data sections;
         a root finder coupled to receive the calculated syndrome and operative to generate at least two roots; and
         a polynomial calculator responsive to the at least two roots and operative to generate at least two error addresses, each identifying a location in the data wherein the error lies,
   wherein the plurality of data sections is four sections and the root finder generates the at least two roots, $Z_1$ and $Z_2$, based upon a Galois Field (GF) ($2^{11}$) calculation.

7. A non-volatile memory system, as recited in claim 6, further including a bus for coupling the controller to the host system wherein the bus operates in conformance with MMC, SD, CF, MS, PCIE, IDE, or SATA standards.

8. A non-volatile memory system, as recited in claim 7, wherein the host system includes a controller for coupling to the bus, wherein the controller operates in conformance with MMC, SD, CF, MS, PCIE, IDE, or SATA standards.

9. A non-volatile memory system, as recited in claim 6, wherein the root finder generates $Z_1$ and $Z_2$, based upon the following equations:

$$Z_1^2 + Z_1 + K = 0$$

and $$Z_2^2 + Z_2 + K = 0,$$

wherein 'K' represents a syndrome.

10. A non-volatile memory system, as recited in claim 6, wherein the root finder includes comparison logic for generating the at least two roots.

11. A non-volatile memory system, as recited in claim 6, wherein the comparison logic is made of a plurality of XOR.

12. A non-volatile memory system, as recited in claim 6, wherein the syndrome calculator includes combinatorial shift and comparison logic for generating each syndrome.

13. A method of detecting errors in information stored in non-volatile memory comprising:
   calculating a plurality of syndromes, each of the syndromes being calculated for a segment of a page of information stored in the non-volatile memory;
   calculating A, B, C using the calculated syndromes, 'A', 'B' and 'C' collectively represent an error bit value at a particular error location;
   determining if the calculated syndromes are equal to each other;
   if the calculated syndromes are determined not to be equal to each other;
   determining if A, B and C are equal to each other;
   if A, B and C are determined to be equal to each other, detecting a single error; and if A, B and C are determined not to be equal to each other, detecting two errors.

14. A method of detecting errors, as recited in claim 13, further including, if the calculated syndromes are determined to be equal to each other, detecting no errors.

15. A method of detecting errors in information stored in non-volatile memory comprising:
Receiving a page of information, the page including data and overhead, the data being organized into a plurality of data sections and the overhead being organized into a plurality of overhead sections;
generating a syndrome for each of the data sections;
calculating A, B, C using the generated syndromes, 'A', 'B', and 'C' collectively represent an error bit value at a particular error location;
if the generated syndromes are determined not to be equal to each other, determining if A, B and C are equal to each other;
if A, B, and C are determined to be equal to each other, detecting a single error; and
if A, B, and C are determined not be equal to each other, detecting two errors.

* * * * *